United States Patent
Zeng et al.

(10) Patent No.: US 12,218,635 B2
(45) Date of Patent: Feb. 4, 2025

(54) POWER AMPLIFIER CIRCUIT

(71) Applicant: HUAWEI TECHNOLOGIES CO., LTD., Guangdong (CN)

(72) Inventors: Zhixiong Zeng, Shanghai (CN); Jie Sun, Shanghai (CN); Hailei Suo, Chengdu (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 833 days.

(21) Appl. No.: 17/333,299

(22) Filed: May 28, 2021

(65) Prior Publication Data

US 2021/0288616 A1 Sep. 16, 2021

Related U.S. Application Data

(63) Continuation of application No. PCT/CN2018/118500, filed on Nov. 30, 2018.

(51) Int. Cl.
*H03F 1/02* (2006.01)
*H03F 1/56* (2006.01)
(Continued)

(52) U.S. Cl.
CPC ............. *H03F 1/0288* (2013.01); *H03F 1/56* (2013.01); *H03F 3/245* (2013.01); *H03F 3/602* (2013.01); *H03F 2200/318* (2013.01)

(58) Field of Classification Search
CPC .................... H03F 1/0288; H03F 2200/318
(Continued)

(56) References Cited

U.S. PATENT DOCUMENTS 7,262,656 B2    8/2007   Shiikuma
7,800,442 B2    9/2010   Lejon
(Continued)

FOREIGN PATENT DOCUMENTS

CN    102394569 A    3/2012
CN    103457541 A    12/2013
(Continued)

OTHER PUBLICATIONS

Jihwan Kim et al: A Fully-Integrated High-Power Linear CMOS Power Amplifier With a Parallel-Series Combining Transformer, IEEE Journal of Solid-State Circuits, IEEE, USA, vol. 47, No. 3, Mar. 2, 2012, pp. 599-614, XP011422467.
(Continued)

*Primary Examiner* — Andrea Lindgren Baltzell
*Assistant Examiner* — Jose E Pinero
(74) *Attorney, Agent, or Firm* — WOMBLE BOND DICKINSON (US) LLP

(57) ABSTRACT

A power amplifier circuit includes: a first branch, including a first amplifier and a first matching network cascaded; a second branch, including a second amplifier and a second matching network cascaded, where a first coupled line enables the first branch and the second branch to form a first combiner; a third branch, including a third amplifier and a third matching network cascaded; and a fourth branch, including a fourth amplifier and a fourth matching network cascaded, where a second coupled line enables the third branch and the fourth branch to form a second combiner. A first output end of the first coupled line is a signal output end of the circuit, and a second output end of the first coupled line is connected to a first output end of the second coupled line, to enable the first combiner and the second combiner to form a series combiner.

20 Claims, 17 Drawing Sheets

(51) Int. Cl.
*H03F 3/24* (2006.01)
*H03F 3/60* (2006.01)

(58) Field of Classification Search
USPC .......................................................... 330/124
See application file for complete search history.

(56) References Cited

U.S. PATENT DOCUMENTS

| | | |
|---|---|---|
| 7,902,921 B2 | 3/2011 | Lejon |
| 8,174,322 B2 | 5/2012 | Heijden et al. |
| 8,203,386 B2 | 6/2012 | Van Der Heijden et al. |
| 9,768,736 B2 | 9/2017 | Qureshi |
| 9,774,300 B2 | 9/2017 | Jin et al. |
| 2007/0080747 A1 | 4/2007 | Klingberg et al. |
| 2009/0102554 A1 | 4/2009 | Lejon |
| 2010/0301933 A1 | 12/2010 | Lejon |
| 2010/0327969 A1 | 12/2010 | Jung et al. |
| 2011/0273236 A1 | 11/2011 | Van Der Heijden et al. |
| 2014/0049318 A1 | 2/2014 | Goswami |
| 2015/0303961 A1* | 10/2015 | Banerjee ................. H03F 1/223 375/287 |
| 2016/0028351 A1 | 1/2016 | Jin et al. |
| 2019/0036487 A1* | 1/2019 | Jiang ..................... H03F 1/0288 |

FOREIGN PATENT DOCUMENTS

| | | |
|---|---|---|
| CN | 106374860 A | 2/2017 |
| CN | 107453714 A | 12/2017 |
| EP | 2011231 B1 | 6/2011 |
| EP | 2388912 A1 | 11/2011 |
| WO | 2007123449 A1 | 11/2007 |
| WO | 2012079542 A1 | 6/2012 |
| WO | 2015180064 A1 | 12/2015 |
| WO | 2017121455 A1 | 7/2017 |

OTHER PUBLICATIONS

Jonas Fritzin et al:: "A wideband fully integrated +30dBm Class-D outphasing RF PA in 65nm CMOS", Integrated Circuits (ISIC), 2011 13th International Symposium on, IEEE, Dec. 12, 2011, pp. 25-28, XP032096184.

* cited by examiner

POWER AMPLIFIER CIRCUIT

CROSS-REFERENCE TO RELATED APPLICATIONS

This application is a continuation of International Application No. PCT/CN2018/118500, filed on Nov. 30, 2018, the disclosure of which is hereby incorporated by reference in its entirety.

TECHNICAL FIELD

This application relates to the electrical field, and in particular, to a power amplifier circuit.

BACKGROUND

In modern digital communications standards, a peak-to-average ratio of a signal is relatively high, which is usually above 8 dB, and may even reach 10 dB. The peak-to-average ratio is a ratio of an amplitude to an RMS value of a waveform. Because the signal works in a non-peak state most of the time, a power amplifier needs to work in a high-power back-off state most of the time. For a conventional class-AB power amplifier, efficiency in power back-off is much lower than efficiency in a peak value. The efficiency may be a ratio of output power to input power of the power amplifier. Therefore, as a peak-to-average ratio of a signal increases, the efficiency of the power amplifier decreases accordingly. Currently, a Doherty power amplification technology, an outphasing power amplification technology, or a Chireix power amplification technology is widely used in the industry to improve efficiency of a power amplifier in power back-off.

A current technology for improving the efficiency of the power amplifier can maintain relatively high efficiency when a power back-off range is relatively small (for example, below about 6 dB). However, when the power amplifier implements a larger power back-off range, an efficiency depression area appears, and a larger power back-off range indicates larger depression in the "efficiency depression area". As a result, efficiency of the power amplifier is not significantly improved.

SUMMARY

This application provides a power amplifier circuit, to improve efficiency of a power amplifier.

According to a first aspect, a power amplifier circuit is provided, and includes: a first branch, including a first amplifier and a first matching network that are cascaded, where a first end of the first branch is a signal input end of the first amplifier, and a second end of the first branch is connected to a first input end of a first coupled line; a second branch, including a second amplifier and a second matching network that are cascaded, where a first end of the second branch is a signal input end of the second amplifier, a second end of the second branch is connected to a second input end of the first coupled line, and the first coupled line enables the first branch and the second branch to form a first combiner; a third branch, including a third amplifier and a third matching network that are cascaded, where a first end of the third branch is a signal input end of the third amplifier, and a second end of the third branch is connected to a first input end of a second coupled line; and a fourth branch, including a fourth amplifier and a fourth matching network that are cascaded, where a first end of the fourth branch is a signal input end of the fourth amplifier, a second end of the fourth branch is connected to a second input end of the second coupled line, and the second coupled line enables the third branch and the fourth branch to form a second combiner. A first output end of the first coupled line is a signal output end of the circuit, and a second output end of the first coupled line is connected to a first output end of the second coupled line, to enable the first combiner and the second combiner to form a series combiner.

In the solution of the power amplifier circuit provided in an embodiment of the application, compared with a conventional power amplifier circuit, the power amplifier circuit can obtain higher efficiency when a power back-off range increases. Further, at the first back-off high-efficiency point, the power amplifier circuit has a lower load-pull ratio, and therefore is more suitable for a high-efficiency power amplifier.

In the solution of the power amplifier circuit provided in an embodiment of the application, because power of the first combiner and the second combiner is series-combined, after a combining network formed by using coupled lines is used, load impedance presented to each branch becomes lower. Therefore, based on the power amplifier circuit provided in an embodiment of the application, a high-power and high-bandwidth power amplifier is easier to implement.

In an embodiment, the circuit further includes 2N branches, where N is an integer greater than 0. A $(2i+3)^{th}$ branch includes a $(2i+3)^{th}$ amplifier and a $(2i+3)^{th}$ matching network that are cascaded, where a first end of the $(2i+3)$th branch is a signal input end of the $(2i+3)^{th}$ amplifier, and a second end of the $2i+3$ branch is connected to a first input end of an $(i+2)^{th}$ coupled line, where $i=1, 2, \ldots$, and N; and a $(2i+4)^{th}$ branch includes a $(2i+4)^{th}$ amplifier and a $(2i+4)^{th}$ matching network that are cascaded, where a first end of the $(2i+4)^{th}$ branch is a signal input end of the $(2i+4)^{th}$ amplifier, a second end of the $2i+4$ branch is connected to a second input end of the $(i+2)^{th}$ coupled line, and the $(i+2)^{th}$ coupled line enables the $(2i+3)^{th}$ branch and the $(2i+4)*h$ branch to form an $(i+2)^{th}$ combiner. A first output end of the $(i+2)^{th}$ coupled line is connected to a second output end of an $(i+1)^{th}$ coupled line, to enable the first combiner to the $(i+2)^{th}$ combiner to form a series combiner.

In an embodiment of the application, compared with the conventional power amplifier circuit, the power amplifier circuit can obtain higher efficiency when a power back-off range increases. Further, the power amplifier circuit has a smaller load-pull ratio and smaller impedance, so that the power amplifier circuit can implement a high-power and high-bandwidth power amplifier.

In an embodiment, a configuration of the first matching network and the second matching network enables the first amplifier and the second amplifier to form a first Doherty power tube pair, a configuration of the third matching network and the fourth matching network enables the third amplifier and the fourth amplifier to form a second Doherty power tube pair, and a configuration of the first coupled line and the second coupled line enables the first Doherty power tube pair and the second Doherty power tube pair to form a Chireix amplifier combiner.

In an embodiment, an electrical length of the first coupled line and an electrical length of the second coupled line are used to determine the first back-off high-efficiency point of the Chireix amplifier combiner.

In an embodiment, a configuration of the first matching network and the second matching network enables the first amplifier and the second amplifier to form a peak power tube pair, a configuration of the third matching network and the fourth matching network enables the third amplifier and the fourth amplifier to form a Chireix power tube pair, and a configuration of the first coupled line and the second coupled line enables the Chireix power tube pair and a power tube of a peak power amplifier, the peak power tube pair to form a Doherty amplifier combiner.

In an embodiment, a configuration of the first matching network and the second matching network enables the first amplifier and the second amplifier to form a first Chireix power tube pair, a configuration of the third matching network and the fourth matching network enables the third amplifier and the fourth amplifier to form a second Chireix power tube pair, and a configuration of the first coupled line and the second coupled line enables the first Chireix power tube pair and the second Chireix power tube pair to form a Chireix amplifier combiner.

In an embodiment, a configuration of the first matching network and the second matching network enables the first amplifier and the second amplifier to form a first Doherty power tube pair, a configuration of the third matching network and the fourth matching network enables the third amplifier and the fourth amplifier to form a second Doherty power tube pair, and a configuration of the first coupled line and the second coupled line enables the first Doherty power tube pair and the second Doherty power tube pair to form a Doherty amplifier combiner.

According to a second aspect, an integrated circuit is provided, where the integrated circuit includes the power amplifier circuit according to any one of the first aspect or embodiments of the first aspect.

According to a third aspect, a chip system is provided, where the chip system includes the power amplifier circuit according to any one of the first aspect or embodiments of the first aspect.

DESCRIPTION OF EMBODIMENTS

The following describes technical solutions of this application with reference to the accompanying drawings.

For ease of understanding, a principle of improving power amplification technology is first described. It should be noted that in the embodiments of this application, a power amplifier may be referred to as a PA for short.

Figure 1:
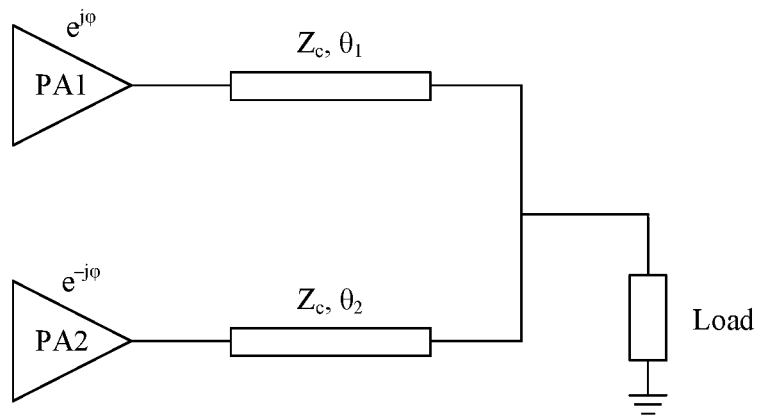
FIG. 1 is a schematic diagram of a principle of an ideal Chireix power amplifier circuit.

FIG. 1 is a schematic diagram of a principle of an ideal Chireix power amplifier circuit. As shown in FIG. 1, a Chireix power amplifier may include a power tube PA1 and a power tube PA2. The two power tubes are combined by using two transmission lines of different lengths. A location at which two branches are combined may be referred to as a combining point. Excitation signal phases of the power tubes PA1 and PA2 are represented by $e^{j\varphi}$ and $e^{-j\varphi}$ respectively. $Z^c$ indicates characteristic impedance of the transmission lines, and $\theta_1$ and $\theta_2$ indicate phases of the transmission lines. A length difference and a phase difference of the two transmission lines determine a working frequency band of the Chireix power amplifier and a location of the first back-off high-efficiency point. A back-off high-efficiency point refers to a location at which a power amplifier reaches maximum efficiency of an ideal power tube, and the first back-off high-efficiency point refers to a high-efficiency point that appears first when a change from maximum back-off power to minimum back-off power occurs.

Figure 2:
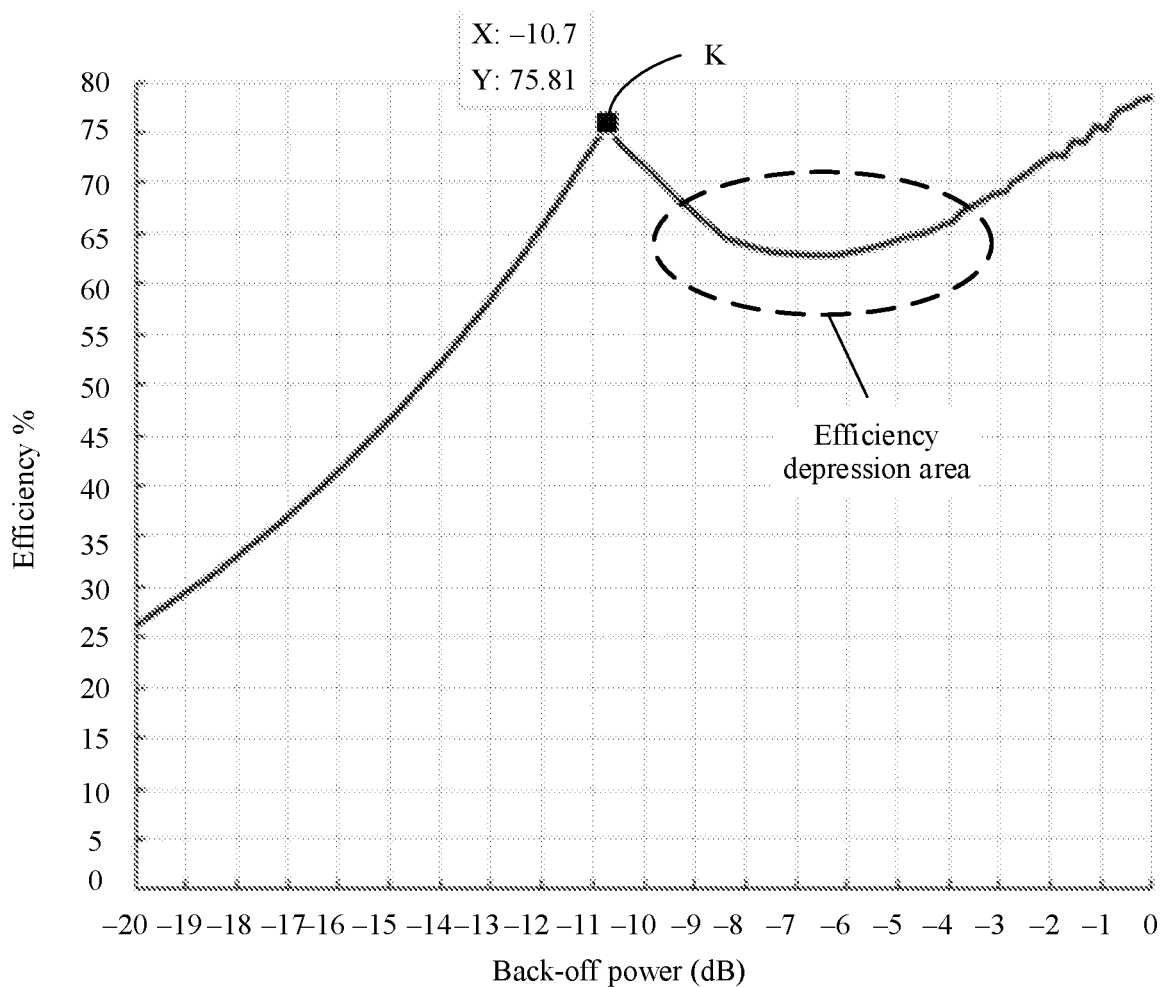
FIG. 2 is a schematic diagram of a relationship between power amplifier efficiency and back-off power of an ideal Chireix power amplifier circuit.

FIG. 2 is a schematic diagram of a relationship between a power amplifier efficiency curve and back-off power of the ideal Chireix power amplifier circuit. FIG. 2 shows a location of the first back-off high-efficiency point K. Generally, when a power back-off range is relatively small, for example, when the back-off range is below about 6 dB, the Chireix power amplifier may maintain relatively high efficiency. However, for a signal with a relatively large peak-to-average ratio, a relatively large power back-off range is required, that is, a location of the first back-off high-efficiency point is relatively low. For example, in FIG. 2, the power back-off range is below about 11 dB, and the first back-off high-efficiency point K is at a location at which back-off power is −10.7 dB and efficiency is 75.81%. In this case, an obvious "efficiency depression area" appears in the power back-off range, and in the "efficiency depression area", the efficiency of the power amplifier decreases. In addition, a larger power back-off range indicates larger depression in the "efficiency depression area". Generally, there is a relatively high probability that the power amplifier works in the "efficiency depression area". For example, the power amplifier works in a power back-off range from 5 dB to 10 dB in FIG. 2. Therefore, the "efficiency depression area" affects an efficiency improvement effect of a modulation signal of the power amplifier.

Figure 3:
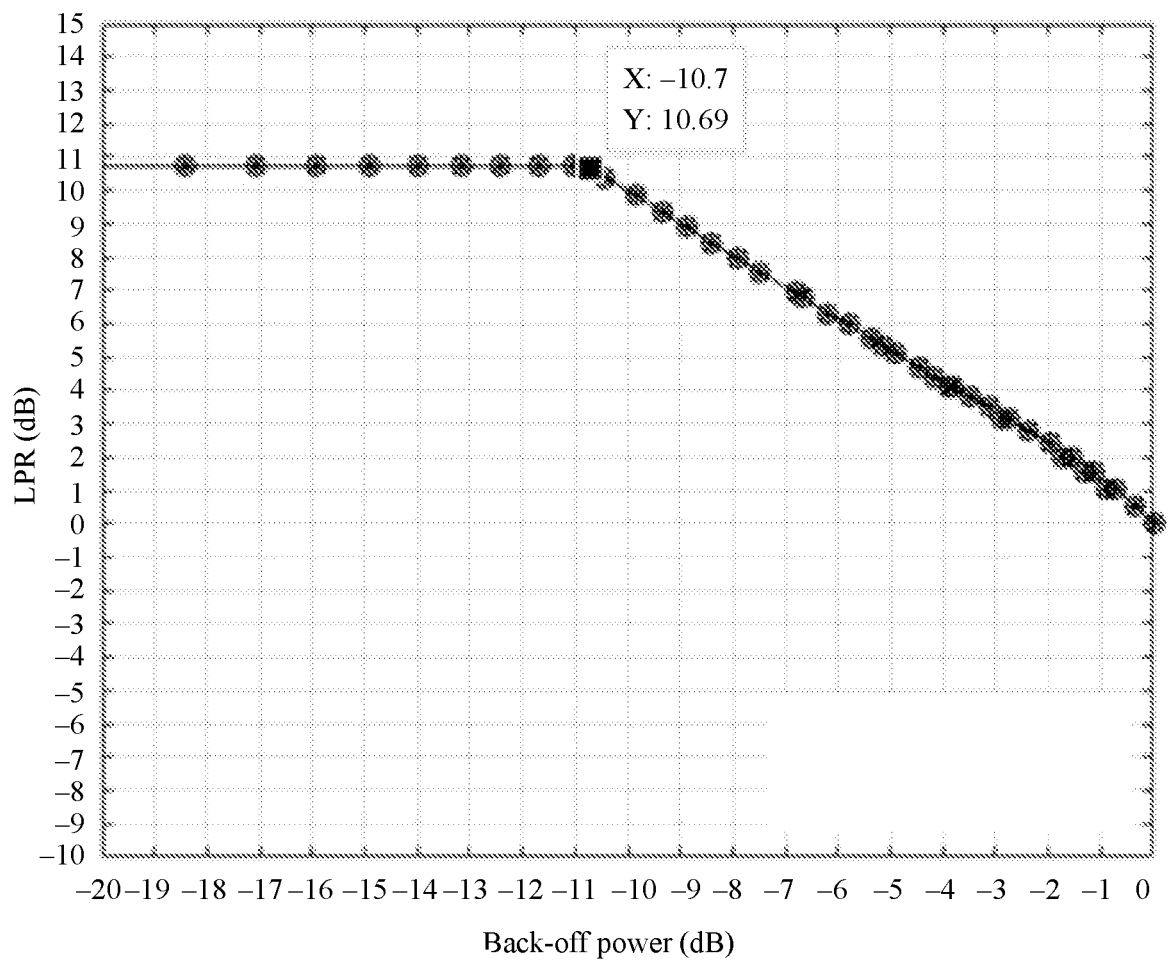
FIG. 3 is a schematic diagram of a relationship between a load-pull ratio (LPR) and back-off power of an ideal Chireix power amplifier circuit.

FIG. 3 is a schematic diagram of a relationship between a load-pull ratio (LPR) and back-off power of the ideal Chireix power amplifier circuit. In FIG. 3, a horizontal coordinate represents the back-off power, and a vertical coordinate represents the load-pull ratio LPR. The load-pull ratio is a standing wave ratio of load impedance to a reflection factor of maximum output power impedance of a power tube. When the load-pull ratio is excessively large, peak efficiency of the power amplifier will decrease sharply. Therefore, the load-pull ratio is expected to be maintained in a relatively small range. However, in the Chireix power amplifier circuit, when a power back-off range is relatively large, load-pull is also relatively large, which causes a decrease in efficiency of the power amplifier. A curve in FIG. 3 shows a relationship between a load-pull ratio and back-off power of the PA1 and the PA2. As shown in FIG. 3, when the back-off power is −10.7 dB, the load-pull ratio of the power tube in the Chireix power amplifier circuit is about 10.7 dB. Therefore, the load-pull is relatively large.

Figure 4:
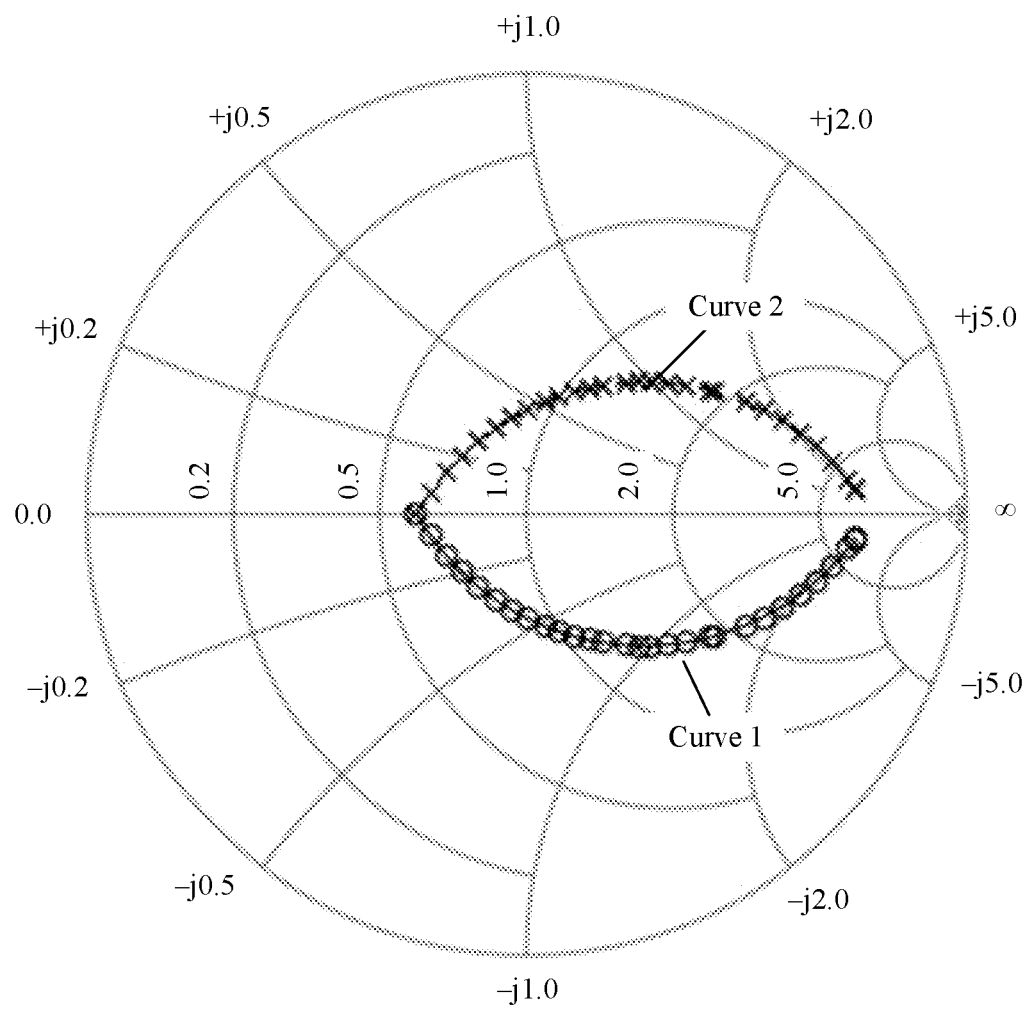
FIG. 4 is a schematic diagram of impedance of a Chireix power amplifier circuit at different output power.

FIG. 4 is a schematic diagram of impedance of the Chireix power amplifier circuit at different output power. 1.0 in FIG. 4 represents normalization of 50 ohms(Ω). A curve 1 in FIG. 4 shows impedance of the PA1 in the Chireix power amplifier circuit at different output power, and a curve 2 shows impedance of the PA2 in the Chireix power amplifier circuit at different output power. As shown in FIG. 4, minimum impedance of PA1 and PA2 is about 50 ohms, and maximum impedance of PA1 and PA2 is about 550 ohms. Therefore, as output power increases, impedance of two load-pull paths of the Chireix power amplifier circuit decreases from 550 ohms to 50 ohms. For a field effect power tube with relatively large output power, output impedance of the field effect power tube is usually small, for example, in an order of magnitude of 1 ohm to 10 ohms. Therefore, when high impedance of 50 ohms to 550 ohms of a combining point is converted to the order of magnitude of 1 ohm to 10 ohms of the power tube, an impedance conversion ratio is very large, which severely limits a bandwidth of a matching circuit.

Figure 5:
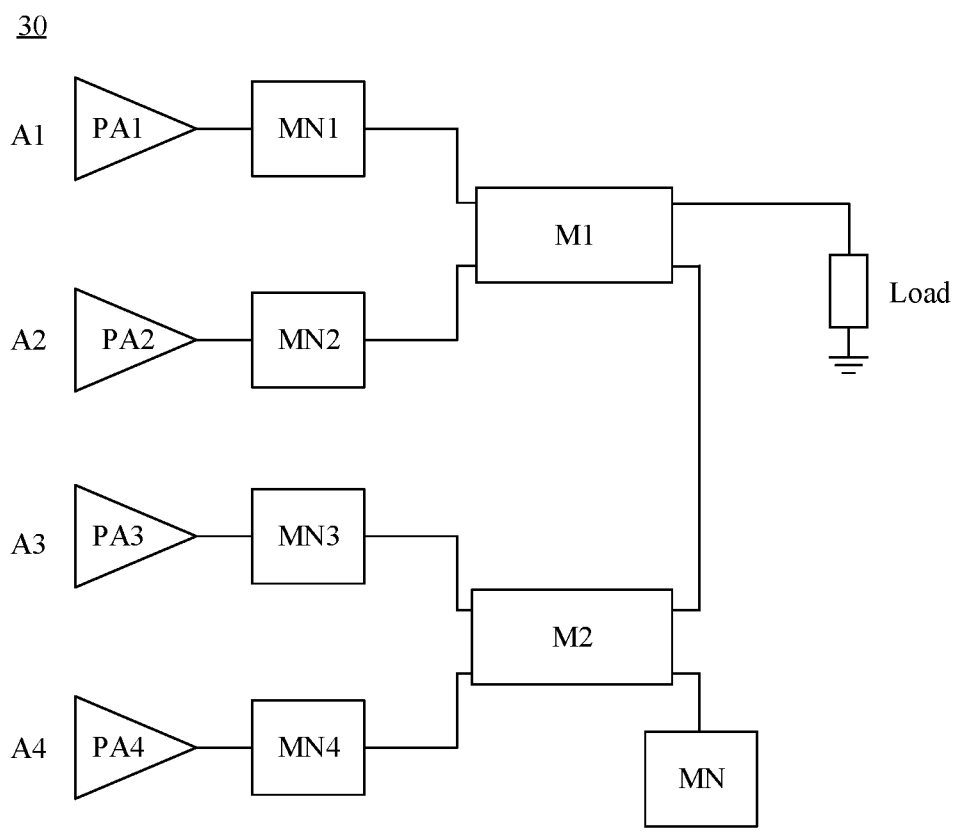
FIG. 5 is a schematic structural diagram of a power amplifier circuit according to an embodiment of this application.

FIG. 5 is a schematic structural diagram of a power amplifier circuit 30 according to an embodiment of this application. As shown in FIG. 5, the power amplifier circuit 30 includes:
- a first branch A1, including a first amplifier PA1 and a first matching network MN1 that are cascaded, where a first end of the first branch A1 is a signal input end of the first amplifier, and a second end of the first branch A1 is connected to a first input end of a first coupled line M1;
- a second branch A2, including a second amplifier PA2 and a second matching network MN2 that are cascaded, where a first end of the second branch A2 is a signal input end of the second amplifier PA2, a second end of the second branch A2 is connected to a second input end of the first coupled line, and the first coupled line M1 enables the first branch A1 and the second branch A2 to form a first combiner, where In an embodiment, the first combiner may be a series combiner or may be a parallel combiner, for example, a serial or parallel connection mode of the first combiner may depend on a form of the first coupled line;
- a third branch A3, including a third amplifier PA3 and a third matching network MN3 that are cascaded, where a first end of the third branch A3 is a signal input end of the third amplifier PA3, and a second end of the third branch A3 is connected to a first input end of a second coupled line M2; and
- a fourth branch A4, including a fourth amplifier PA4 and a fourth matching network MN4 that are cascaded, where a first end of the fourth branch A4 is a signal input end of the fourth amplifier PA4, a second end of the fourth branch A4 is connected to a second input end of the second coupled line M2, and the second coupled line M2 enables the third branch A3 and the fourth branch A4 to form a second combiner.

In an embodiment, the second combiner may be a series combiner or a parallel combiner. For example, a serial or parallel connection mode of the second combiner may depend on a form of the first coupled line.

A first output end of the first coupled line M1 is a signal output end of the power amplifier circuit 30, and a second output end of the first coupled line M1 is connected to a first output end of the second coupled line M2, to enable the first combiner and the second combiner to form a series combiner.

In an embodiment, the foregoing matching networks, for example, the first matching network MN1 to the fourth matching network MN4, are configured to match the branches. For example, impedance, phases, and the like of the branches are configured according to different requirements. In an example, the matching network may include transmission lines of different lengths and different phases. This is not limited in an embodiment of the application.

In an embodiment, the two branches corresponding to each coupled line may form a class-AB combiner, an outphasing combiner, a Chireix combiner, or a Doherty combiner by using the coupled line. For example, the first branch A1 and the second branch A2 may form a class-AB power tube pair, an outphasing power tube pair, a Chireix power tube pair, or a Doherty power tube pair by using the first coupled line M1. Alternatively, the third branch circuit A3 and the fourth branch circuit A4 may form a class-AB power tube pair, an outphasing power tube pair, a Chireix power tube pair, or a Doherty power tube pair by using the second coupled line M2. Two networks respectively corresponding to the first coupled line and the second coupled line may be further combined to form a class-AB combiner, an outphasing combiner, a Chireix combiner, or a Doherty combiner.

Figure 6:
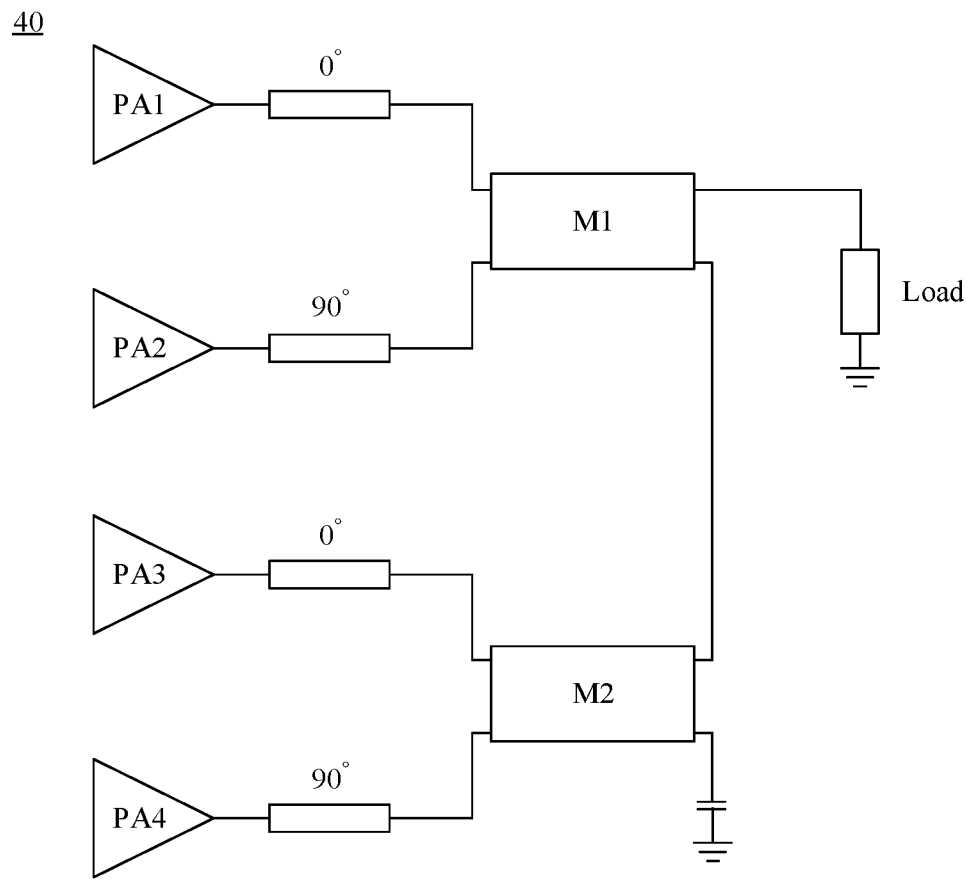
FIG. 6 is a schematic structural diagram of a power amplifier circuit according to another embodiment of this application.

In an embodiment, FIG. 6 is a schematic diagram of a power amplifier circuit 40 according to another embodiment of this application. As shown in FIG. 6, a configuration of a first matching network MN1 and a second matching network MN2 enables a first amplifier PA1 and a second amplifier PA2 to form a first Doherty power tube pair P1, a configuration of a third matching network MN3 and a fourth matching network MN4 enables a third amplifier PA3 and a fourth amplifier PA4 to form a second Doherty power tube pair P2, and a configuration of a first coupled line M1 and a second coupled line M2 enables the first Doherty power tube pair P1 and the second Doherty power tube pair P2 to form a Chireix amplifier combiner. The first matching network MN1 to the fourth matching network MN4 may be transmission lines of different lengths and phases. For example, as an example instead of a limitation, phases of the first matching network MN1 and the second matching network MN2 are 0° and 90°, so that the PA1 and the PA2 form the Doherty power tube pair. Similarly, phases of the third matching network MN3 and the fourth matching network MN4 are 0° and 90°, so that the PA3 and the PA4 form the Doherty power tube pair. Electrical lengths L1 and L2 of the first coupled line M1 and the second coupled line M2 may be used to determine a location of the first back-off high-efficiency point of the Chireix amplifier combiner.

Figure 7:
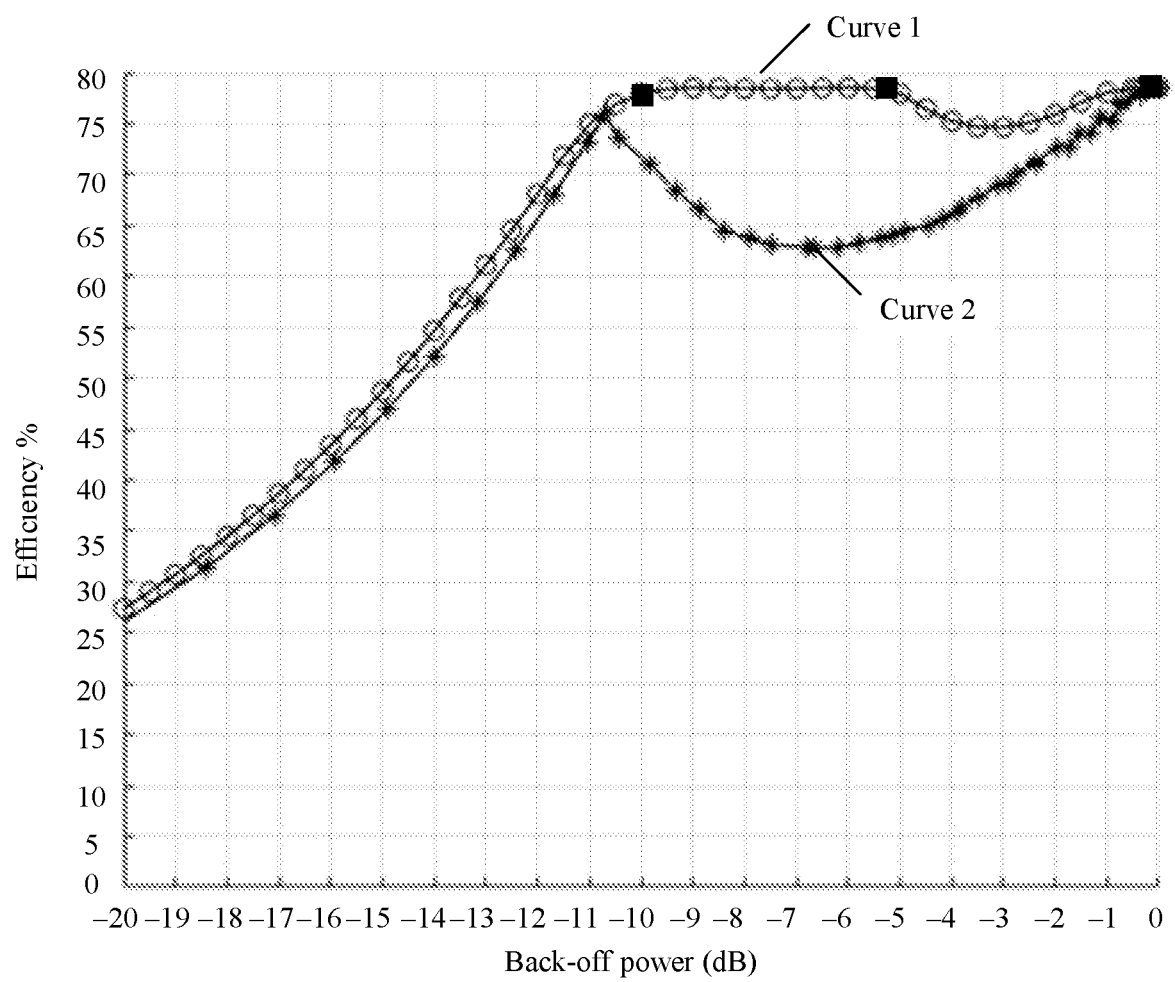
FIG. 7 is a schematic diagram of a relationship between power amplifier efficiency and back-off power of a power amplifier circuit according to another embodiment of this application.

FIG. 7 shows a relationship between power amplifier efficiency and back-off power of the power amplifier circuit 40 in FIG. 6 and a relationship between those of the Chireix power amplifier circuit in FIG. 1. A curve 1 corresponds to the power amplifier circuit 40, and a curve 2 corresponds to the Chireix power amplifier circuit in FIG. 1. Compared with a conventional Chireix power amplifier circuit, the power amplifier circuit 40 introduces more back-off high-efficiency points in the efficiency curve. For example, FIG. 7 shows three back-off high-efficiency points. The first back-off high-efficiency point is at a location of about −10 dB, the second back-off high-efficiency point is at a location of about −5 dB, and the third back-off high-efficiency point is at a location of 0 dB. When the back-off high-efficiency points are added, an "efficiency depression area" is significantly improved. Therefore, the power amplifier circuit 40 can still maintain relatively high efficiency in a large power back-off range.

Figure 8:
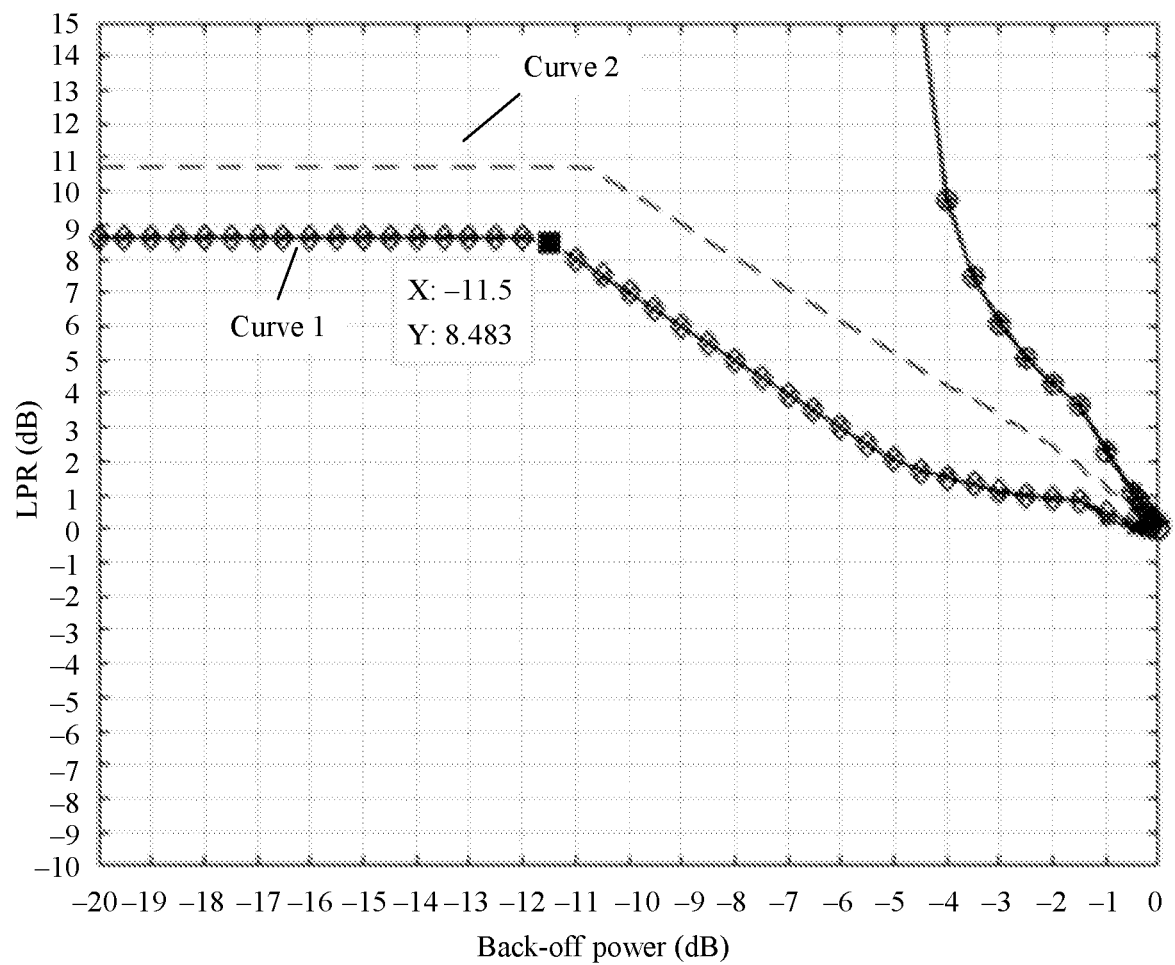
FIG. 8 is a schematic diagram of a relationship between a load-pull ratio and back-off power of a power amplifier circuit according to another embodiment of this application.

FIG. 8 is a schematic diagram of a relationship between a load-pull ratio and back-off power of a power amplifier circuit according to another embodiment of this application. A curve 1 is a schematic diagram of a relationship between a load-pull ratio and back-off power of the power amplifier circuit 40, and a curve 2 is a schematic diagram of a relationship between a load-pull ratio and back-off power of the Chireix power amplifier circuit in FIG. 1. As shown in FIG. 8, at the first back-off high-efficiency point, that is, at a location of about −11 dB, a load-pull ratio of the amplifiers PA1 and PA2 of the Chireix power amplifier circuit is about 11 dB. However, a load-pull ratio of the amplifiers PA1 and PA3 of the power amplifier circuit 40 is 8 dB, which is about 3 dB smaller than that of the Chireix power amplifier. It can be learned that the load-pull ratio of the power amplifier circuit 40 in an embodiment of the application is smaller than that of the conventional power amplifier circuit. Therefore, a power amplifier circuit with higher efficiency can be implemented.

Figure 9:
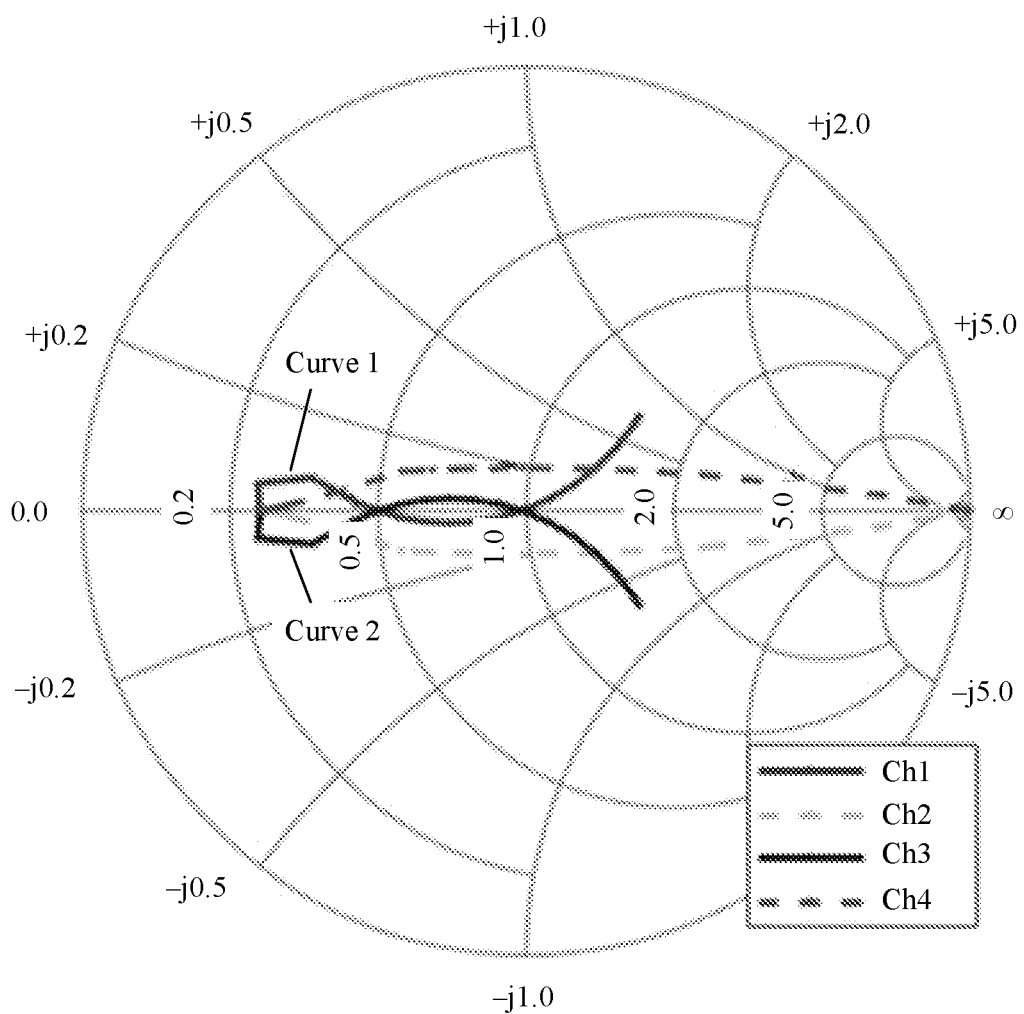
FIG. 9 is a schematic diagram of impedance of a power amplifier circuit at different output power according to another embodiment of this application.

FIG. 9 is a schematic diagram of impedance of a power amplifier circuit at different output power according to another embodiment of this application. A curve 1 and a curve 2 in FIG. 9 respectively show impedance of the first amplifier PA1 and the third amplifier PA3 of the power amplifier circuit 40. The first amplifier PA1 and the third amplifier PA3 are main power amplifiers of the power amplifier circuit 40. In FIG. 9, three intersection points of the curve 1 and the curve 2 respectively correspond to impedance of the three back-off high-efficiency points of the power amplifier circuit 40. As shown in FIG. 9, between the first back-off high-efficiency point and the third back-off high-efficiency point, load impedance changes from about 12.5 ohms to about 50 ohms. It may be understood that, as output power of the power amplifier circuit 40 increases, the load impedance decreases from 50 ohms to 12.5 ohms. Therefore, impedance at a location of a combining point of the power amplifier circuit 40 is relatively low, and a high-power wideband power amplifier is more easily implemented.

Figure 10:
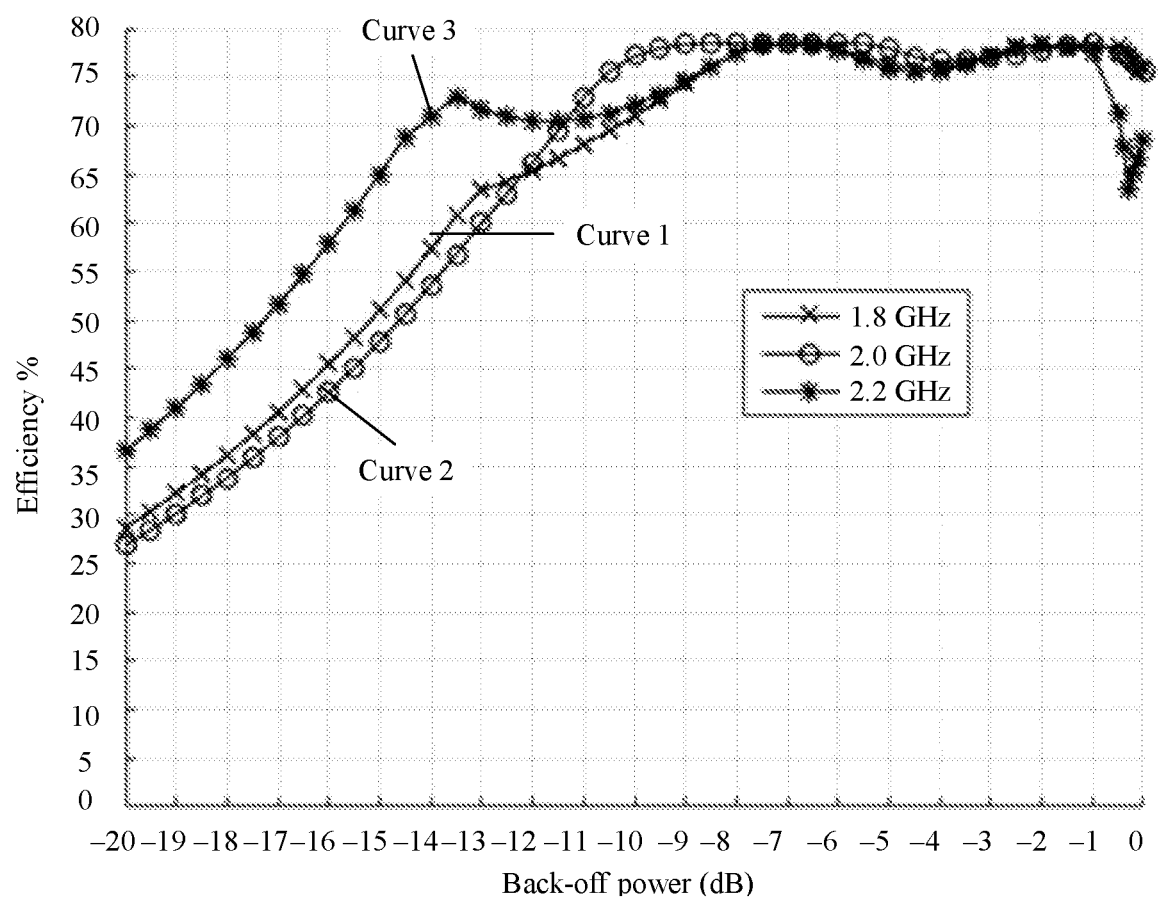
FIG. 10 is a schematic diagram of power amplifier efficiency curves of a power amplifier circuit under input signals of different frequencies according to an embodiment of this application.

FIG. 10 is a schematic diagram of power amplifier efficiency curves of a power amplifier circuit under input signals of different frequencies according to an embodiment of this application. It is assumed that even mode impedance $Z_{even}$ of the first coupled line M1 and the second coupled line M2 is 220 ohms. A curve 1 is an efficiency curve under an input signal with a frequency of 1.8 GHz, a curve 2 is an efficiency curve under an input signal with a frequency of 2.0 GHz, and a curve 3 is an efficiency curve under an input signal with a frequency of 2.2 GHz. It can be learned that when a frequency of an input signal ranges from 1.8 GHz to 2.2 GHz, that is, when a bandwidth is approximately 0.4 GHz, maximum efficiency of the power amplifier circuit 40 is approximately 78%, and efficiency is higher than 70% in a power back-off range below −10 dB. It can be learned that the power amplifier circuit in an embodiment of the application also has relatively high power efficiency in a high-bandwidth and a large-power back-off range.

Figure 11:
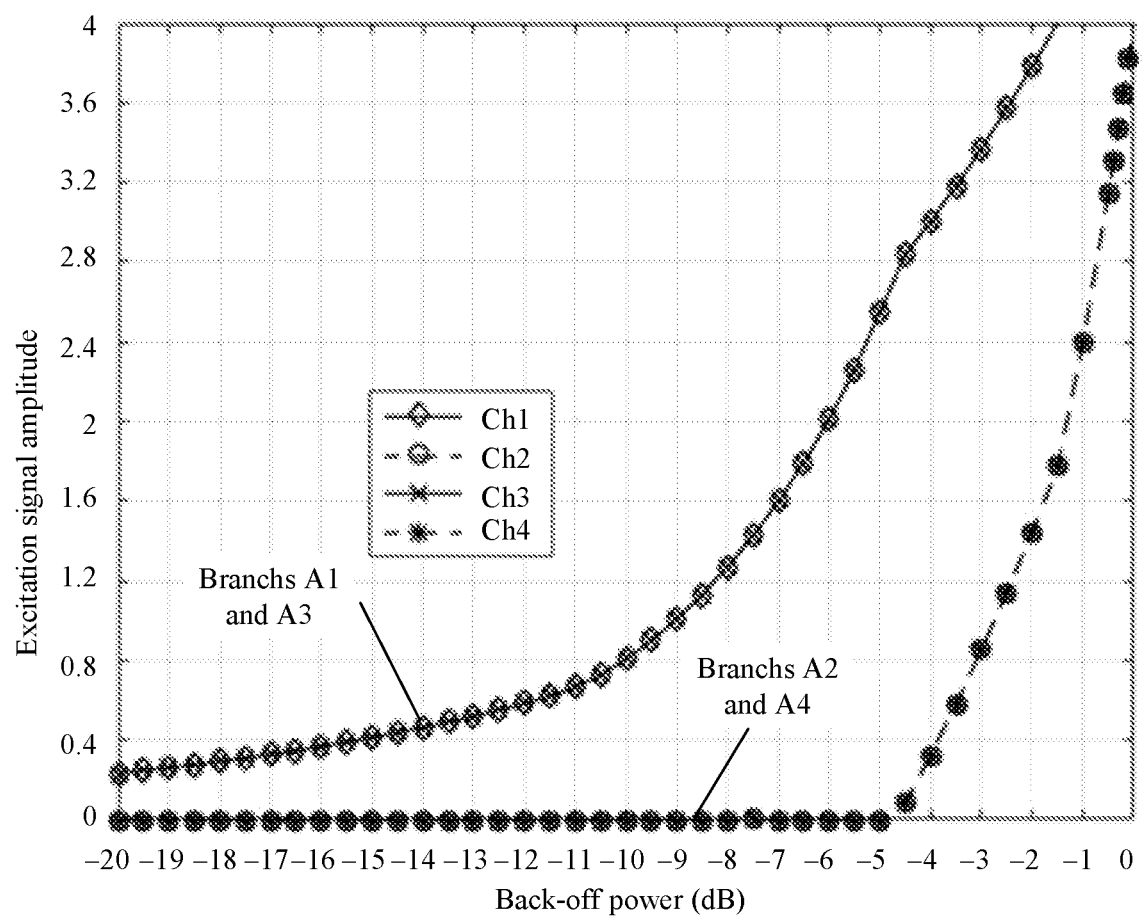
FIG. 11 is a schematic diagram of a relationship between an excitation signal amplitude and back-off power of each branch of a power amplifier circuit according to an embodiment of this application.

FIG. 11 is a schematic diagram of a relationship between an excitation signal amplitude and back-off power of each branch of the power amplifier circuit 40 according to an embodiment of this application. As shown in FIG. 11, amplitudes of excitation signals of the second branch A2 and the fourth branch A4 are 0 when a power back-off range exceeds 5 dB. In other words, the second branch A2 and the fourth branch A4 are in a working state only when the power back-off range is within 5 dB, which is the same as a working mode of a peak Doherty power amplifier.

Figure 12:
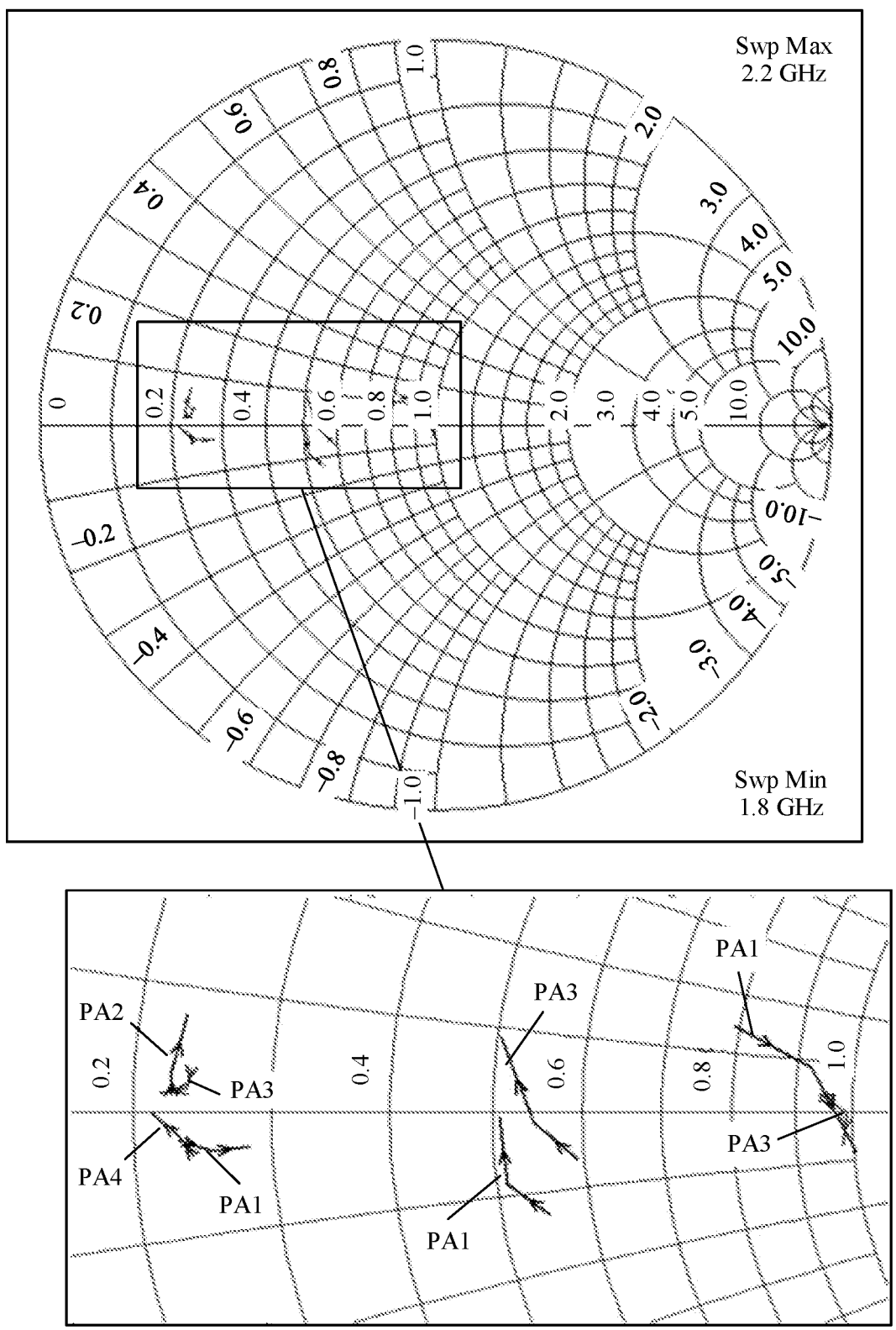
FIG. 12 is a schematic diagram of an impedance bandwidth characteristic of a power amplifier circuit according to an embodiment of this application.

FIG. 12 is a schematic diagram of an impedance bandwidth characteristic of the power amplifier circuit 40 according to an embodiment of this application. FIG. 12 is a schematic diagram of impedance of the first amplifier PA1 to the fourth amplifier PA4 in the power amplifier circuit 40 when an input signal frequency changes from 1.8 GHz to 2.2 GHz. FIG. 12 separately shows impedance of the first amplifier PA1 to the fourth amplifier PA4 when back-off power is about 0 dB, −5 dB, and −10 dB. It can be learned from FIG. 11 that the second amplifier PA2 and the fourth amplifier PA4 do not work when a power back-off range is above 5 dB. Therefore, FIG. 12 does not show impedance of the second amplifier PA2 and the fourth amplifier PA4 when the back-off power is −5 dB and −10 dB. As shown in FIG. 12, under a high bandwidth, impedance change ranges of the first amplifier PA1 to the fourth amplifier PA4 are relatively small, and an impedance convergence characteristic of the power amplifier circuit 40 is relatively good.

Figure 13:
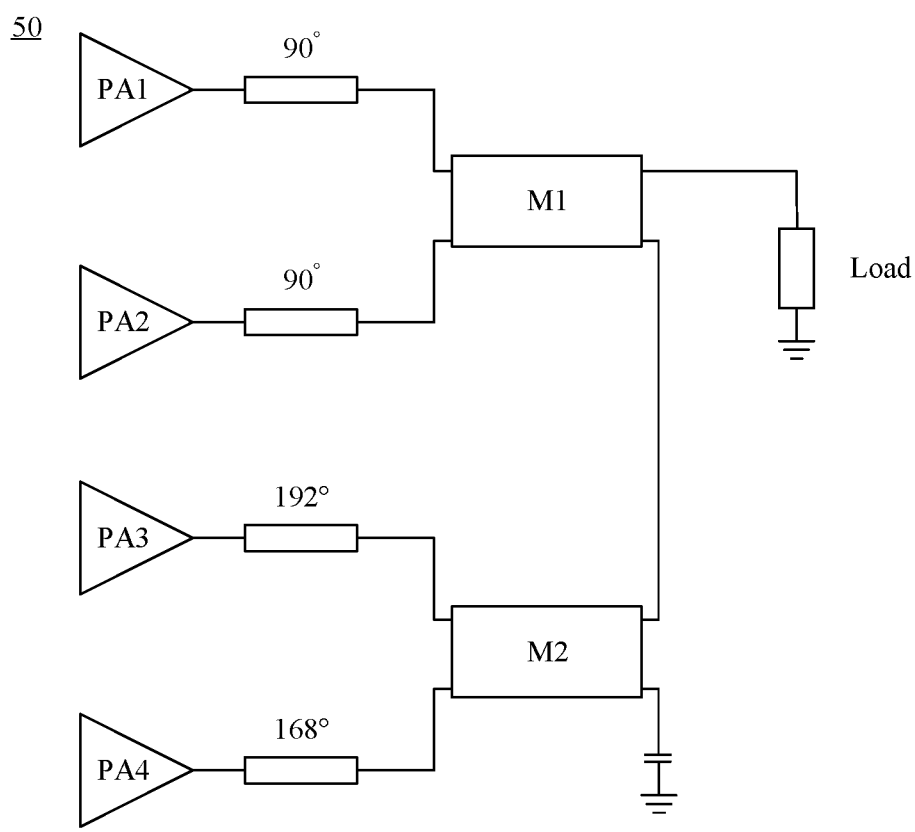
FIG. 13 is a schematic structural diagram of a power amplifier circuit according to another embodiment of this application.

In an embodiment, FIG. 13 is a schematic structural diagram of a power amplifier circuit 50 according to another embodiment of this application. As shown in FIG. 13, a configuration of a first matching network MN1 and a second matching network MN2 enables a first amplifier PA1 and a second amplifier PA2 to form a peak power tube pair P1, a configuration of a third matching network MN3 and a fourth matching network MN4 enables a third amplifier PA3 and a fourth amplifier PA4 to form a Chireix power tube pair P2, and a configuration of a first coupled line M1 and a second coupled line M2 enables the Chireix power tube pair P2 and the peak power tube pair P1 to form a Doherty amplifier combiner. The peak power tube pair PT forms a peak power amplifier of the Doherty amplifier combiner, and the Chireix power tube pair P2 forms a main power amplifier of the Doherty amplifier combiner. The first matching network MN1 to the fourth matching network MN4 may be transmission lines of different lengths and phases. For example, as an example instead of a limitation, phases of the first matching network MN1 and the second matching network MN2 are both 90°, so that the PA1 and the PA2 form a peak power tube pair of the Doherty amplifier combiner. Phases of the third matching network MN3 and the fourth matching network MN4 are 192° and 168°, so that the PA3 and the PA4 form the Chireix power tube pair. An electrical length of a transmission line of the third matching network MN3 is L3, and an electrical length of a transmission line of the fourth matching network MN4 is L4. L3, L4, and maximum power output capabilities of the first amplifier PA1 to the fourth amplifier PA4 may be jointly used to determine a location of a back-off high-efficiency point of the power amplifier circuit 50.

Figure 14:
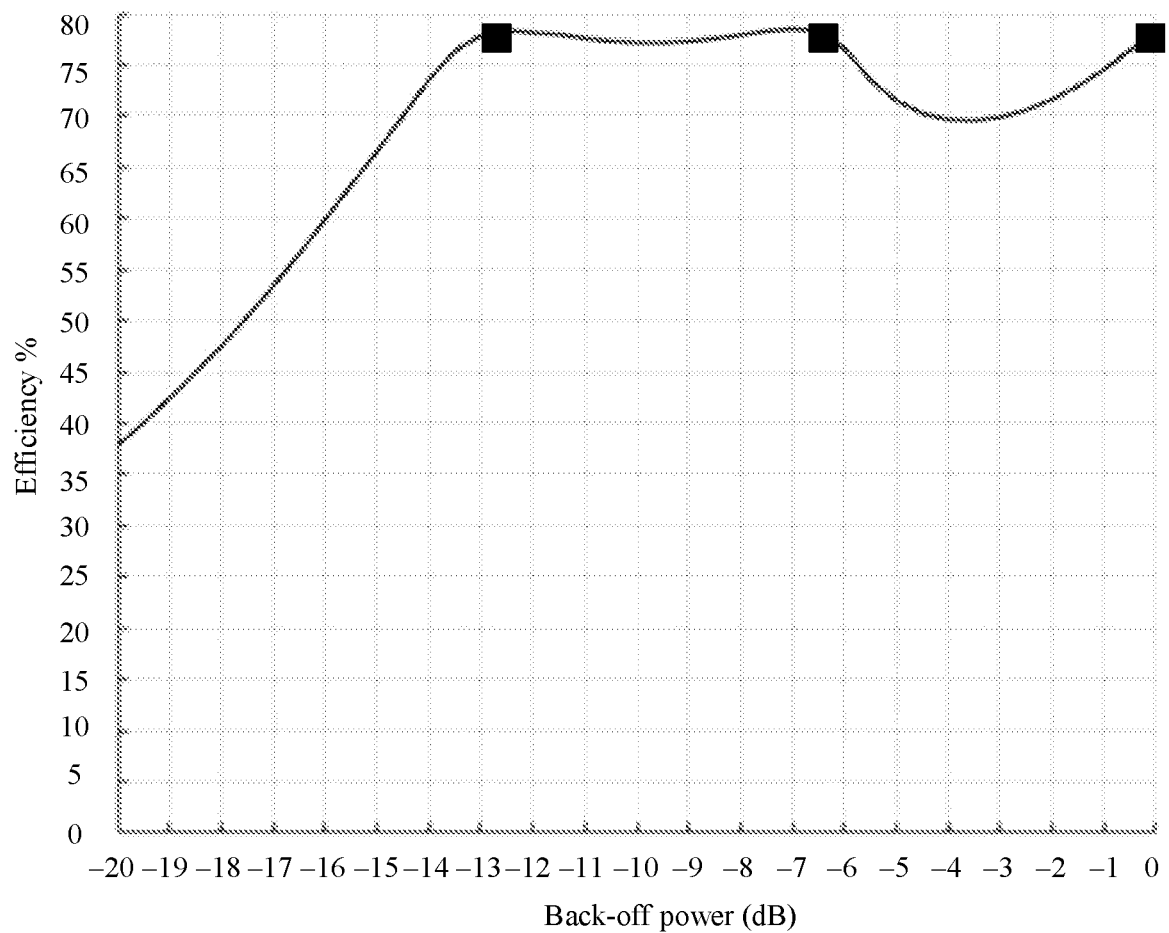
FIG. 14 is a schematic diagram of a relationship between power amplifier efficiency and back-off power of a power amplifier circuit according to another embodiment of this application.

FIG. 14 is a schematic diagram of a relationship between power amplifier efficiency and back-off power of the power amplifier circuit 50 according to another embodiment of this application. As shown in FIG. 14, the power amplifier circuit 50 also introduces three back-off high-efficiency points in an efficiency curve. A location of the first back-off high-efficiency point is about −13 dB, a location of the second back-off high-efficiency point is about −6.5 dB, and a location of the third back-off high-efficiency point is 0 dB. In addition, when a power back-off range is from 6.5 dB to 13 dB, the power amplifier circuit 50 maintains relatively high efficiency, which is greater than about 76%. When a power back-off range is from 0 dB to 6.5 dB, efficiency of the power amplifier circuit 50 is also above 70%. Compared with the conventional Chireix power amplifier circuit shown in FIG. 2, the power amplifier circuit 50 improves efficiency of a power amplifier in a relatively large power back-off range, and improves a case of an "efficiency depression area".

Figure 15:
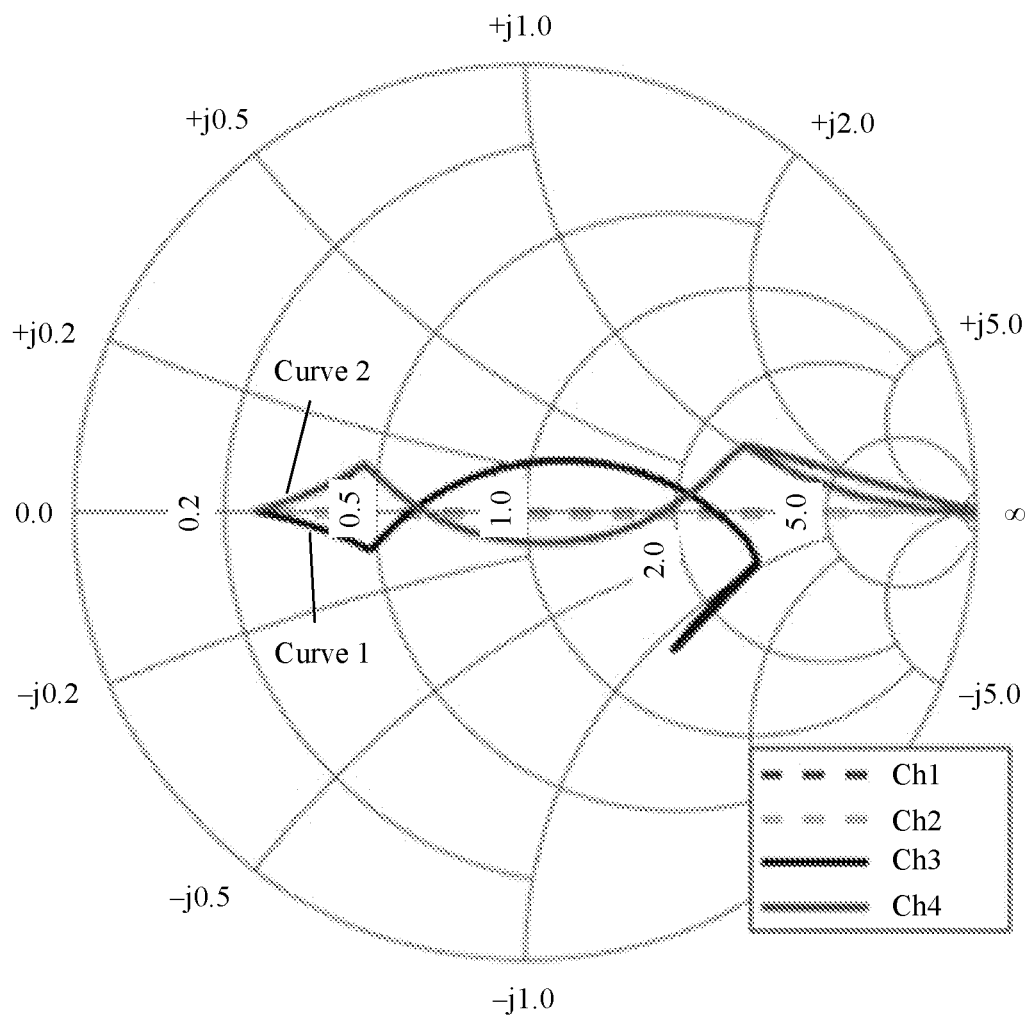
FIG. 15 is a schematic diagram of impedance of a power amplifier circuit at different output power according to another embodiment of this application.

FIG. 15 is a schematic diagram of impedance of a power amplifier circuit at different output power according to another embodiment of this application. A curve 1 and a curve 2 in FIG. 15 respectively show impedance of the third amplifier PA3 and the fourth amplifier PA4 of the power amplifier circuit 50. In FIG. 15, three intersection points of the curve 1 and the curve 2 respectively correspond to the three back-off high-efficiency points of the power amplifier circuit 50. As shown in FIG. 15, between the first back-off high-efficiency point and the third back-off high-efficiency point, load impedance changes from about 12.5 ohms to about 100 ohms. It may be understood that, as output power of the power amplifier circuit 50 increases, the load impedance decreases from 100 ohms to 12.5 ohms. Therefore, compared with FIG. 4, the load impedance of the power amplifier circuit 50 is lower than that of the conventional Chireix power amplifier circuit, and a high-power wideband power amplifier is more easily implemented.

Figure 16:
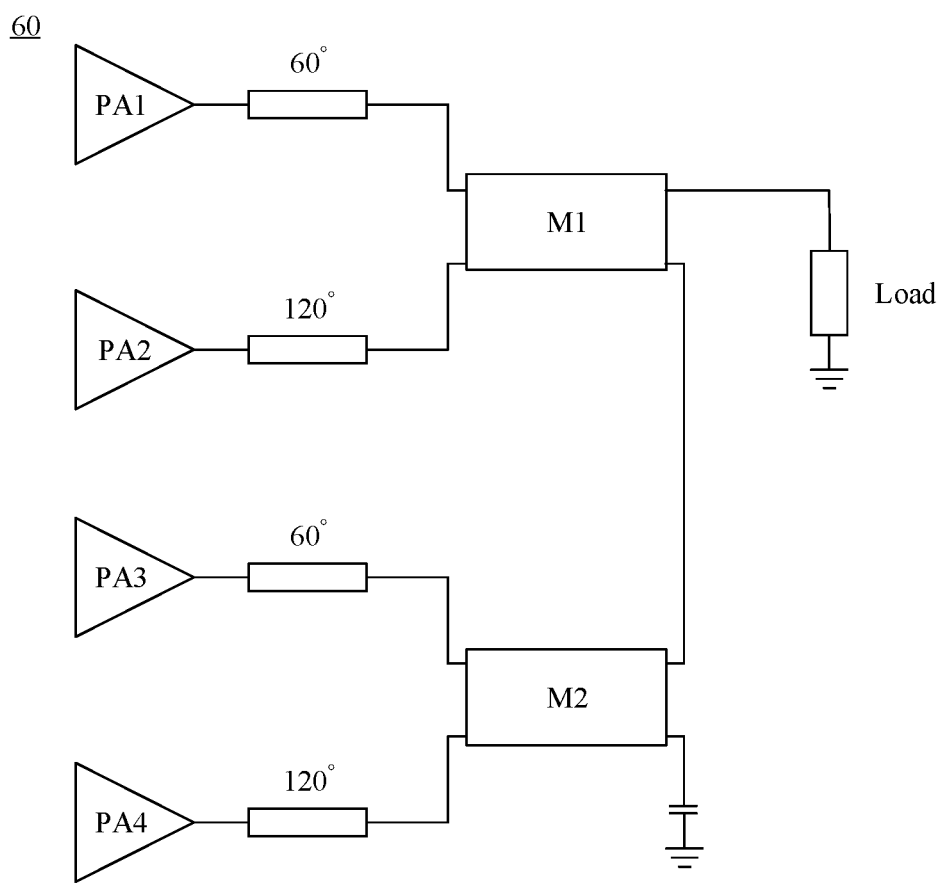
FIG. 16 is a schematic structural diagram of a power amplifier circuit according to another embodiment of this application.

In an embodiment, FIG. 16 is a schematic structural diagram of a power amplifier circuit 60 according to another embodiment of this application. As shown in FIG. 16, a configuration of a first matching network MN1 and a second matching network MN2 enables a first amplifier PA1 and a second amplifier PA2 to form a first Chireix power tube pair P1, a configuration of a third matching network MN3 and a fourth matching network MN4 enables a third amplifier PA3 and a fourth amplifier PA4 to form a second Chireix power tube pair P2, and a configuration of a first coupled line M1 and a second coupled line M2 enables the first Chireix power tube pair P1 and the second Chireix power tube pair P2 to form a Chireix amplifier combiner. The first matching network MN1 to the fourth matching network MN4 may be transmission lines of different lengths and phases. For example, as an example instead of a limitation, phases of the first matching network MN1 and the second matching network MN2 are 60° and 120° respectively, so that the PA1 and the PA2 form the Chireix power tube pair. Similarly, phases of the third matching network MN3 and the fourth matching network MN4 are 60° and 120° respectively, so that the PA3 and the PA4 form the Chireix power tube pair. A length of the first coupled line M1 is L1, and a length of the second coupled line M2 is L2. $Z_{odd}$ represents odd mode impedance of a coupled line, and $Z_{even}$ represents even mode impedance of the coupled line.

The foregoing structures of the power amplifier circuits shown in FIG. 6, FIG. 13, and FIG. 16 are merely used as examples. In an embodiment, when the description of the power amplifier circuit 30 in FIG. 5 is satisfied, the power amplifier in an embodiment of the application may alternatively form the power amplifier circuit in another manner. For example, in an embodiment, a configuration of a first matching network MN1 and a second matching network MN2 enables a first amplifier PA1 and a second amplifier PA2 to form a first Doherty power tube pair, a configuration of a third matching network MN3 and a fourth matching network MN4 enables a third amplifier PA3 and a fourth amplifier PA4 to form a second Doherty power tube pair, and a configuration of a first coupled line M1 and a second coupled line M2 enables the first Doherty power tube pair P1 and the second Doherty power tube pair P2 to form a Doherty amplifier combiner.

In the solution of the power amplifier circuit provided in an embodiment of the application, compared with the conventional power amplifier circuit, the power amplifier circuit can obtain higher efficiency when a power back-off range increases. In addition, at the first back-off high-efficiency point, the power amplifier circuit has a lower load-pull ratio, and therefore is more suitable for a high-efficiency power amplifier.

In the solution of the power amplifier circuit provided in an embodiment of the application, because power of the first combiner and the second combiner is series-combined, after a combining network formed by using coupled lines is used, load impedance presented to each branch becomes lower. Therefore, based on the power amplifier circuit provided in an embodiment of the application, a high-power and high-bandwidth power amplifier is easier to implement.

In an embodiment, based on the power amplifier circuits shown in FIG. 5, FIG. 6, FIG. 13, and FIG. 16 or another power amplifier circuit, the power amplifier circuit in the embodiments of this application may further include more branches.

Figure 17:
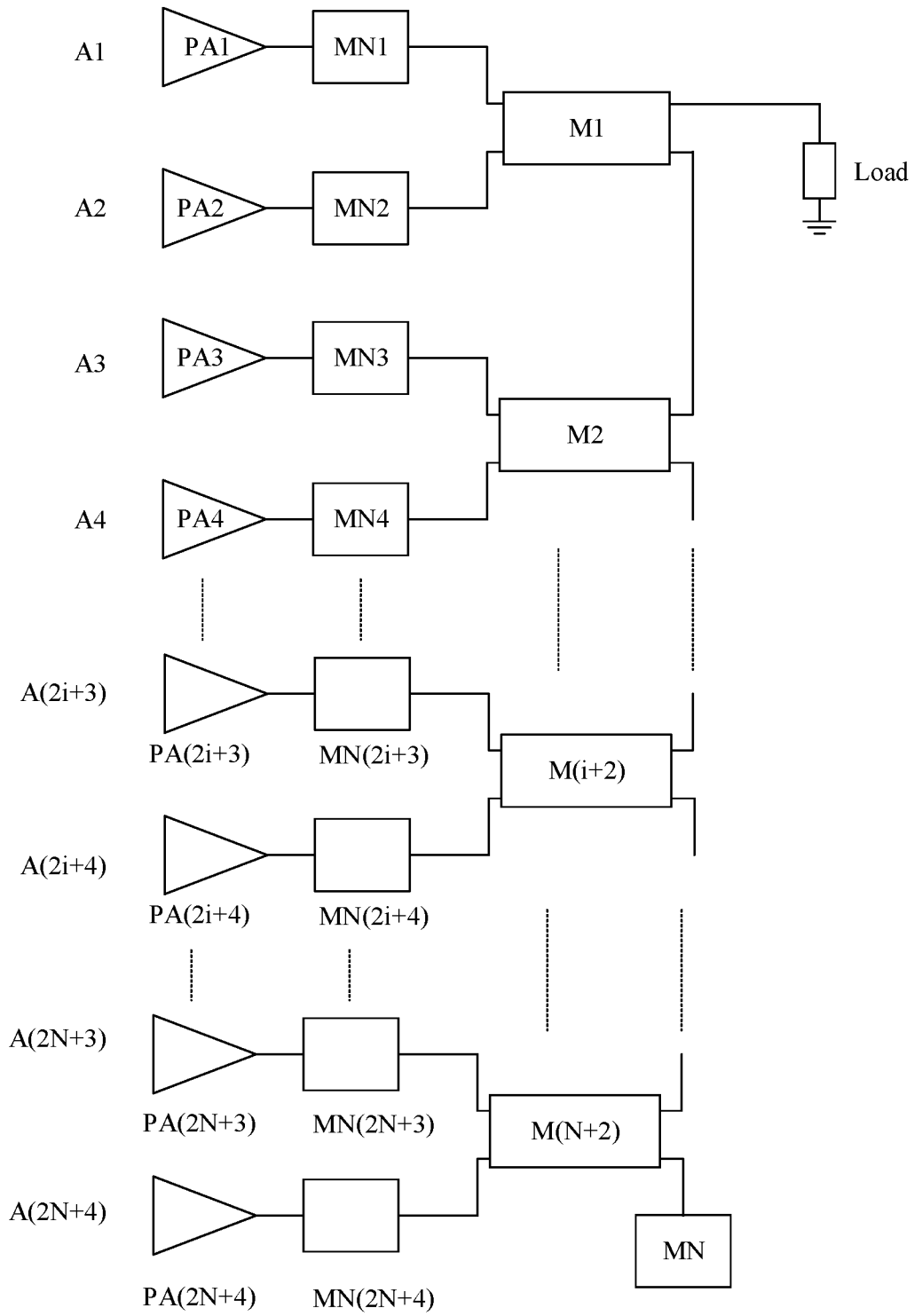
FIG. 17 is a schematic structural diagram of a power amplifier circuit according to another embodiment of this application.

FIG. 17 is a schematic structural diagram of a power amplifier circuit 80 according to another embodiment of this application. As shown in FIG. 17, the power amplifier circuit 80 may further include 2N branches, where N is an integer greater than 0.

A $(2i+3)^{th}$ branch A(2i+3) includes a $(2i+3)^{th}$ amplifier PA(2i+3) and a $(2i+3)^{th}$ matching network MN(2i+3) that are cascaded, where a first end of the $(2i+3)^{th}$ branch is a signal input end of the $(2i+3)^{th}$ amplifier, and a second end of the $(2i+3)^{th}$ branch is connected to a first input end of an $(i+2)^{th}$ coupled line M(i+2), where i=1, 2, . . . , and N.

A $(2i+4)^{th}$ branch A(2i+4) includes a $(2i+4)^{th}$ amplifier PA(2i+4) and a $(2i+4)^{th}$ matching network MN(2i+4) that are cascaded, where a first end of the $(2i+4)^{th}$ branch A(2i+4) is a signal input end of the $(2i+4)^{th}$ amplifier PA(2i+4), a second end of the $(2i+4)^{th}$ branch A(2i+4) is connected to a second input end of the $(i+2)^{th}$ coupled line M(i+2), and the $(i+2)^{th}$ coupled line M(i+2) enables the $(2i+3)^{th}$ branch A(2i+3) and the $(2i+4)^{th}$ branch A(2i+4) to form an $(i+2)^{th}$ combiner.

A first output end of the $(i+2)^{th}$ coupled line M(i+2) is connected to a second output end of an $(i+1)^{th}$ coupled line M(i+1), to enable the first combiner to the $(i+2)^{th}$ combiner to form a series combiner. In this way, the first combiner to an $(N+2)^{th}$ combiner form a series combiner.

In an embodiment, a second output end of an $(N+2)^{th}$ coupled line M(N+2) may be connected to a corresponding matching network MN.

In an embodiment of the application, compared with a conventional power amplifier circuit, the power amplifier circuit can obtain higher efficiency when a power back-off range increases. Further, the power amplifier circuit has a smaller load-pull ratio and smaller impedance, so that the power amplifier circuit can implement a high-power and high-bandwidth power amplifier.

In an embodiment of the application, compared with the conventional power amplifier circuit, the power amplifier circuit can obtain higher efficiency when the power back-off range increases. Further, the power amplifier circuit has a smaller load-pull ratio and smaller impedance, so that the power amplifier circuit can implement a high-power and high-bandwidth power amplifier.

In the solution of the power amplifier circuit provided in an embodiment of the application, power of the first combiner to the $(N+2)^{th}$ combiner is series-combined. Therefore, after a combining network formed by using coupled lines is used, load impedance presented to each branch becomes lower. Therefore, based on the power amplifier circuit provided in an embodiment of the application, a high-power and high-bandwidth power amplifier is easier to implement.

In an embodiment, each coupled line in an embodiment of the application, for example, a first coupled line M1 or a second coupled line M2, may be a coupled line with four ports. The foregoing four ports may be a first input end IN1, a second input end IN2, a first output end OUT1, and a second output end OUT2. For example, (1) to (8) in FIG. 18 are schematic structural diagrams of different forms of coupled lines used in an embodiment of the application.

Figure 18:
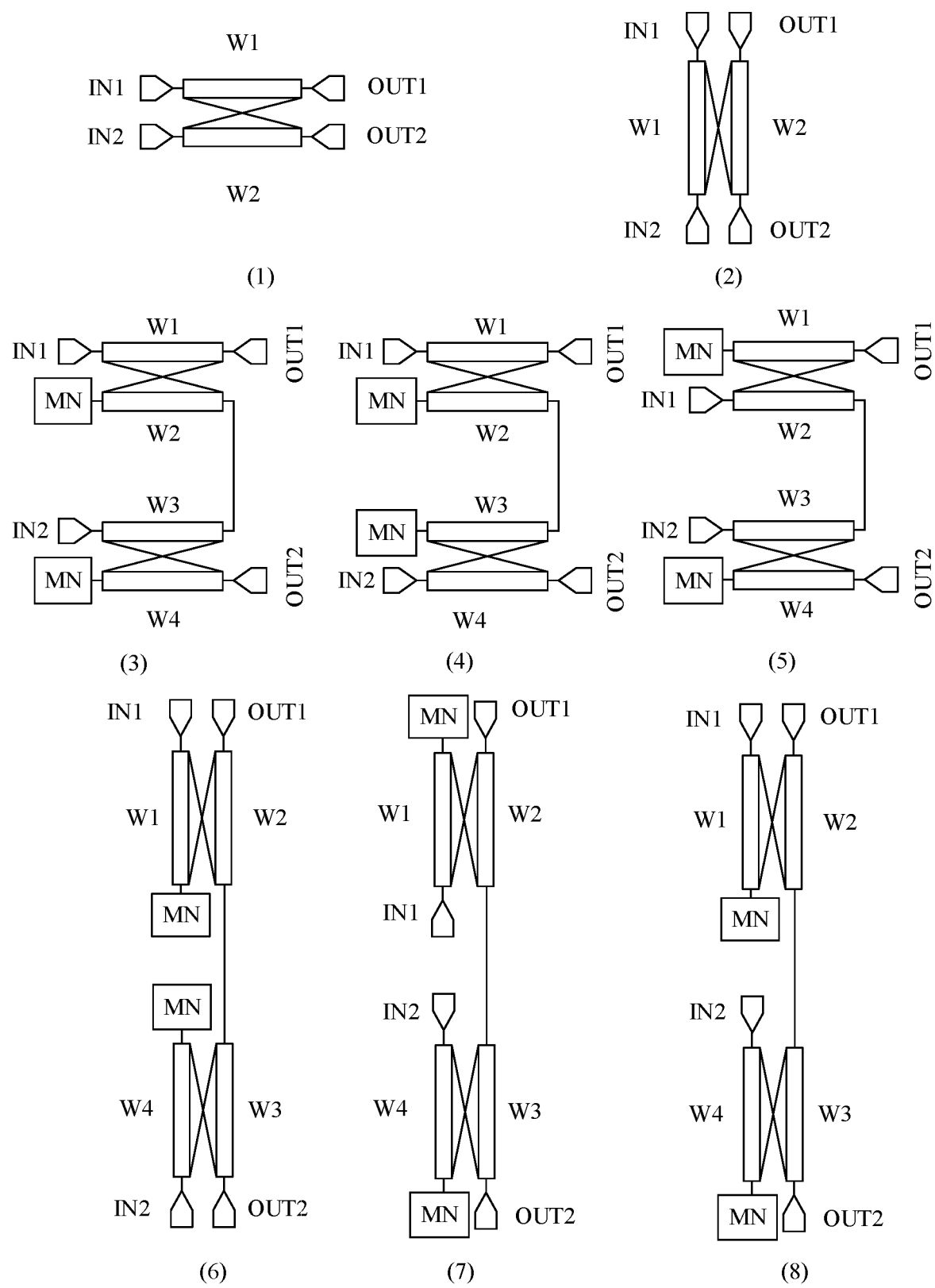
FIG. 18 is a schematic structural diagram of different forms of coupled lines according to an embodiment of this application.

In (1) in FIG. 18, the coupled lines may include a first microstrip W1 and a second microstrip W2 that are coupled to each other. Two ends of the first microstrip W1 are a first input end IN1 and a first output end OUT1, and two ends of the second microstrip W2 are a second input end IN2 and a second output end OUT2.

In (2) in FIG. 18, the coupled lines may include a first microstrip W1 and a second microstrip W2 that are coupled to each other. Two ends of the first microstrip W1 are a first input end IN1 and a second input end IN2, and two ends of the second microstrip W2 are a second output end OUT1 and a second output end OUT2.

In (3) in FIG. 18, the coupled lines may include a first microstrip W1 and a second microstrip W2 that are coupled to each other, and a third microstrip W3 and a fourth microstrip W4 that are coupled to each other. A first end and a second end of the first microstrip W1 are a first input port IN1 and a first output port OUT1 respectively. A first end of the third microstrip W3 is a second input port IN2, a second end of the fourth microstrip W4 is a second output port OUT2, and a second end of the second microstrip W2 is connected to a second end of the third microstrip W3, and a first end of the second microstrip W2 and a first end of the fourth microstrip W4 are separately connected to a corresponding matching network MN.

In (4) in FIG. 18, the coupled lines may include a first microstrip W1 and a second microstrip W2 that are coupled to each other, and a third microstrip W3 and a fourth microstrip W4 that are coupled to each other. A first end and a second end of the first microstrip W1 are a first input port IN1 and a first output port OUT1 respectively. A first end and a second end of the fourth microstrip W4 are a second input port IN2 and a second output port OUT2 respectively. A second end of the second microstrip W2 is connected to a second end of the third microstrip W3, and a first end of the second microstrip W2 and a first end of the third microstrip W3 are separately connected to a corresponding matching network MN.

In (5) in FIG. 18, the coupled lines may include a first microstrip W1 and a second microstrip W2 that are coupled to each other, and a third microstrip W3 and a fourth microstrip W4 that are coupled to each other. A first end of the second microstrip W2 is a first input port IN1, and a second end of the first microstrip W1 is a first output port OUT1. A first end of the third microstrip W3 is a second input port IN2, and a second end of the fourth microstrip W4 is a second output port OUT2. A second end of the second microstrip W2 is connected to a second end of the third microstrip W3, and a first end of the first microstrip W1 and a first end of the fourth microstrip W4 are separately connected to a corresponding matching network MN.

In (6) in FIG. 18, the coupled lines may include a first microstrip W1 and a second microstrip W2 that are coupled to each other, and a third microstrip W3 and a fourth microstrip W4 that are coupled to each other. A first end of the first microstrip W1 is a first input port IN1, and a second end of the fourth microstrip W4 is a second input port IN2. A first end of the second microstrip W2 is a first output port OUT1, and a second end of the third microstrip W3 is a second output port OUT2. A second end of the second microstrip W2 is connected to a first end of the third microstrip W3, and a second end of the first microstrip W1 and a first end of the fourth microstrip W4 are separately connected to a corresponding matching network MN.

In (7) in FIG. 18, the coupled lines may include a first microstrip W1 and a second microstrip W2 that are coupled to each other, and a third microstrip W3 and a fourth microstrip W4 that are coupled to each other. A second end of the first microstrip W1 is a first input port IN1, and a first end of the fourth microstrip W4 is a second input port IN2. A first end of the second microstrip W2 is a first output port OUT1, and a second end of the third microstrip W3 is a second output port OUT2. A second end of the second microstrip W2 is connected to a first end of the third microstrip W3, and a first end of the first microstrip W1 and a second end of the fourth microstrip W4 are separately connected to a corresponding matching network MN.

In (8) in FIG. 18, the coupled lines may include a first microstrip W1 and a second microstrip W2 that are coupled to each other, and a third microstrip W3 and a fourth microstrip W4 that are coupled to each other. A first end of the first microstrip W1 is a first input port IN1, and a first end of the fourth microstrip W4 is a second input port IN2. A first end of the second microstrip W2 is a first output port OUT1, and a second end of the third microstrip W3 is a second output port OUT2. A second end of the second microstrip W2 is connected to a first end of the third microstrip W3, and a second end of the first microstrip W1 and a second end of the fourth microstrip W4 are separately connected to a corresponding matching network MN.

In an embodiment, the microstrips in (1) to (8) in FIG. 18 may also be replaced with lumped elements such as inductors, capacitors, or resistors.

The foregoing descriptions are merely embodiments of the application, but are not intended to limit the protection scope of this application. Any variation or replacement readily figured out by one of ordinary skill in the art within the technical scope disclosed in this application shall fall within the protection scope of this application. Therefore, the protection scope of this application shall be subject to the protection scope of the claims.

What is claimed is:

1. A power amplifier circuit, comprising:
    a first branch, comprising a first amplifier and a first matching network that are cascaded, wherein a first end of the first branch is a signal input end of the first amplifier, and a second end of the first branch is connected to a first input end of a first coupled line;
    a second branch, comprising a second amplifier and a second matching network that are cascaded, wherein a first end of the second branch is a signal input end of the second amplifier, a second end of the second branch is connected to a second input end of the first coupled line, and the first coupled line enables the first branch and the second branch to form a first combiner;
    a third branch, comprising a third amplifier and a third matching network that are cascaded, wherein a first end of the third branch is a signal input end of the third amplifier, and a second end of the third branch is connected to a first input end of a second coupled line; and
    a fourth branch, comprising a fourth amplifier and a fourth matching network that are cascaded, wherein a first end of the fourth branch is a signal input end of the fourth amplifier, a second end of the fourth branch is connected to a second input end of the second coupled line, and the second coupled line enables the third branch and the fourth branch to form a second combiner, wherein
    a first output end of the first coupled line is a signal output end of the power amplifier circuit, and a second output end of the first coupled line is connected to a first output end of the second coupled line, to enable the first combiner and the second combiner to form a series combiner, wherein the first coupled line and the second coupled line each have four ports including the first input end, the second input end, the first output end, and the second output end, and each includes a first microstrip and a second microstrip that are coupled to each other.

2. The circuit according to claim 1, further comprising 2N branches, wherein N is an integer greater than 0, wherein
    a $(2i+3)^{th}$ branch comprises a $(2i+3)^{th}$ amplifier and a $(2i+3)^{th}$ matching network that are cascaded, wherein a first end of the $(2i+3)^{th}$ branch is a signal input end of the $(2i+3)^{th}$ amplifier, wherein a second end of the $2i+3$ branch is connected to a first input end of an $(i+2)^{th}$ coupled line, wherein i=1, 2, . . . , and N; wherein
    a $(2i+4)^{th}$ branch comprises a $(2i+4)^{th}$ amplifier and a $(2i+4)^{th}$ matching network that are cascaded, wherein a first end of the $(2i+4)^{th}$ branch is a signal input end of the $(2i+4)^{th}$ amplifier, wherein a second end of the $2i+4$ branch is connected to a second input end of the $(i+2)^{th}$ coupled line, wherein the $(i+2)^{th}$ coupled line enables the $(2i+3)^{th}$ branch and the $(2i+4)^{th}$ branch to form an $(i+2)^{th}$ combiner; and wherein
    a first output end of the $(i+2)^{th}$ coupled line is connected to a second output end of an $(i+1)^{th}$ coupled line, to enable the first combiner to the $(i+2)^{th}$ combiner to form a series combiner.

3. The circuit according to claim 1, wherein a configuration of the first matching network and the second matching network enables the first amplifier and the second amplifier to form a first Doherty power tube pair, wherein a configuration of the third matching network and the fourth matching network enables the third amplifier and the fourth amplifier to form a second Doherty power tube pair, and wherein a configuration of the first coupled line and the second coupled line enables the first Doherty power tube pair and the second Doherty power tube pair to form a Chireix amplifier combiner.

4. The circuit according to claim 3, wherein an electrical length of the first coupled line and an electrical length of the second coupled line are used to determine a first back-off high-efficiency point of the Chireix amplifier combiner.

5. The circuit according to claim 1, wherein a configuration of the first matching network and the second matching network enables the first amplifier and the second amplifier to form a peak power tube pair, wherein a configuration of the third matching network and the fourth matching network enables the third amplifier and the fourth amplifier to form a Chireix power tube pair, and wherein a configuration of the first coupled line and the second coupled line enables the Chireix power tube pair and the peak power tube pair to form a Doherty amplifier combiner.

6. The circuit according to claim 1, wherein a configuration of the first matching network and the second matching network enables the first amplifier and the second amplifier to form a first Chireix power tube pair, wherein a configuration of the third matching network and the fourth matching network enables the third amplifier and the fourth amplifier to form a second Chireix power tube pair, and wherein a configuration of the first coupled line and the second coupled line enables the first Chireix power tube pair and the second Chireix power tube pair to form a Chireix amplifier combiner.

7. The circuit according to claim 1, wherein a configuration of the first matching network and the second matching network enables the first amplifier and the second amplifier to form a first Doherty power tube pair, wherein a configuration of the third matching network and the fourth matching network enables the third amplifier and the fourth amplifier to form a second Doherty power tube pair, and wherein a configuration of the first coupled line and the second coupled line enables the first Doherty power tube pair and the second Doherty power tube pair to form a Doherty amplifier combiner.

8. A system, comprising:
    a power amplifier circuit, comprising
    a first branch, comprising a first amplifier and a first matching network that are cascaded, wherein a first end of the first branch is a signal input end of the first amplifier, and a second end of the first branch is connected to a first input end of a first coupled line;
    a second branch, comprising a second amplifier and a second matching network that are cascaded, wherein a first end of the second branch is a signal input end of the second amplifier, a second end of the second branch is connected to a second input end of the first coupled line, and the first coupled line enables the first branch and the second branch to form a first combiner;
    a third branch, comprising a third amplifier and a third matching network that are cascaded, wherein a first end of the third branch is a signal input end of the third amplifier, and a second end of the third branch is connected to a first input end of a second coupled line; and a fourth branch, comprising a fourth amplifier and a fourth matching network that are cascaded, wherein a first end of the fourth branch is a signal input end of the fourth amplifier, a second end of the fourth branch is connected to a second input end of the second coupled line, and the second coupled line enables the third branch and the fourth branch to form a second combiner, wherein a first output end of the first coupled line is a signal output end of the circuit, and a second output end of the first coupled line is connected to a first output end of the second coupled line, to enable the first combiner and the second combiner to form a series combiner, wherein the first coupled line and the second coupled line each have four ports including the first input end, the second input end, the first output end, and the second output end, and each includes a first microstrip and a second microstrip that are coupled to each other.

9. The system according to claim 8, further comprising 2N branches, wherein N is an integer greater than 0, wherein a $(2i+3)^{th}$ branch comprises a $(2i+3)^{th}$ amplifier and a $(2i+3)^{th}$ matching network that are cascaded, wherein a first end of the $(2i+3)^{th}$ branch is a signal input end of the $(2i+3)^{th}$ amplifier, wherein a second end of the 2i+3 branch is connected to a first input end of an $(i+2)^{th}$ coupled line, wherein i=1, 2, . . . , and N; wherein a $(2i+4)^{th}$ branch comprises a $(2i+4)^{th}$ amplifier and a $(2i+4)^{th}$ matching network that are cascaded, wherein a first end of the $(2i+4)^{th}$ branch is a signal input end of the $(2i+4)^{th}$ amplifier, wherein a second end of the 2i+4 branch is connected to a second input end of the $(i+2)^{th}$ coupled line, wherein the $(i+2)^{th}$ coupled line enables the $(2i+3)^{th}$ branch and the $(2i+4)^{th}$ branch to form an $(i+2)^{th}$ combiner; and wherein a first output end of the $(i+2)^{th}$ coupled line is connected to a second output end of an $(i+1)^{th}$ coupled line, to enable the first combiner to the $(i+2)^{th}$ combiner to form a series combiner.

10. The system according to claim 8, wherein a configuration of the first matching network and the second matching network enables the first amplifier and the second amplifier to form a first Doherty power tube pair, wherein a configuration of the third matching network and the fourth matching network enables the third amplifier and the fourth amplifier to form a second Doherty power tube pair, and wherein a configuration of the first coupled line and the second coupled line enables the first Doherty power tube pair and the second Doherty power tube pair to form a Chireix amplifier combiner.

11. The system according to claim 10, wherein an electrical length of the first coupled line and an electrical length of the second coupled line are used to determine a first back-off high-efficiency point of the Chireix amplifier combiner.

12. The system according to claim 8, wherein a configuration of the first matching network and the second matching network enables the first amplifier and the second amplifier to form a peak power tube pair, wherein a configuration of the third matching network and the fourth matching network enables the third amplifier and the fourth amplifier to form a Chireix power tube pair, and wherein a configuration of the first coupled line and the second coupled line enables the Chireix power tube pair and the peak power tube pair to form a Doherty amplifier combiner.

13. The system according to claim 8, wherein a configuration of the first matching network and the second matching network enables the first amplifier and the second amplifier to form a first Chireix power tube pair, wherein a configuration of the third matching network and the fourth matching network enables the third amplifier and the fourth amplifier to form a second Chireix power tube pair, and wherein a configuration of the first coupled line and the second coupled line enables the first Chireix power tube pair and the second Chireix power tube pair to form a Chireix amplifier combiner.

14. The system according to claim 8, wherein a configuration of the first matching network and the second matching network enables the first amplifier and the second amplifier to form a first Doherty power tube pair, wherein a configuration of the third matching network and the fourth matching network enables the third amplifier and the fourth amplifier to form a second Doherty power tube pair, and wherein a configuration of the first coupled line and the second coupled line enables the first Doherty power tube pair and the second Doherty power tube pair to form a Doherty amplifier combiner.

15. A integrated circuit, comprising:
a power amplifier circuit, comprising
a first branch, comprising a first amplifier and a first matching network that are cascaded, wherein a first end of the first branch is a signal input end of the first amplifier, and a second end of the first branch is connected to a first input end of a first coupled line;
a second branch, comprising a second amplifier and a second matching network that are cascaded, wherein a first end of the second branch is a signal input end of the second amplifier, a second end of the second branch is connected to a second input end of the first coupled line, and the first coupled line enables the first branch and the second branch to form a first combiner;
a third branch, comprising a third amplifier and a third matching network that are cascaded, wherein a first end of the third branch is a signal input end of the third amplifier, and a second end of the third branch is connected to a first input end of a second coupled line; and
a fourth branch, comprising a fourth amplifier and a fourth matching network that are cascaded, wherein a first end of the fourth branch is a signal input end of the fourth amplifier, a second end of the fourth branch is connected to a second input end of the second coupled line, and the second coupled line enables the third branch and the fourth branch to form a second combiner, wherein
a first output end of the first coupled line is a signal output end of the circuit, and a second output end of the first coupled line is connected to a first output end of the second coupled line, to enable the first combiner and the second combiner to form a series combiner, wherein the first coupled line and the second coupled line each have four ports including the first input end, the second input end, the first output end, and the second output end, and each includes a first microstrip and a second microstrip that are coupled to each other.

16. The integrated circuit according to claim 15, further comprising 2N branches, wherein N is an integer greater than 0, wherein a $(2i+3)^{th}$ branch comprises a $(2i+3)^{th}$ amplifier and a $(2i+3)^{th}$ matching network that are cascaded, wherein a first end of the $(2i+3)^{th}$ branch is a signal input end of the $(2i+3)^{th}$ amplifier, wherein a second end of the 2i+3 branch is connected to a first input end of an $(i+2)^{th}$ coupled line, wherein i=1, 2, ..., and N; wherein a $(2i+4)^{th}$ branch comprises a $(2i+4)^{th}$ amplifier and a $(2i+4)^{th}$ matching network that are cascaded, wherein a first end of the $(2i+4)^{th}$ branch is a signal input end of the $(2i+4)^{th}$ amplifier, wherein a second end of the 2i+4 branch is connected to a second input end of the $(i+2)^{th}$ coupled line, wherein the $(i+2)^{th}$ coupled line enables the $(2i+3)^{th}$ branch and the $(2i+4)^{th}$ branch to form an $(i+2)^{th}$ combiner; and wherein a first output end of the $(i+2)^{th}$ coupled line is connected to a second output end of an $(i+1)^{th}$ coupled line, to enable the first combiner to the $(i+2)^{th}$ combiner to form a series combiner.

17. The integrated circuit according to claim 15, wherein a configuration of the first matching network and the second matching network enables the first amplifier and the second amplifier to form a first Doherty power tube pair, wherein a configuration of the third matching network and the fourth matching network enables the third amplifier and the fourth amplifier to form a second Doherty power tube pair, and wherein a configuration of the first coupled line and the second coupled line enables the first Doherty power tube pair and the second Doherty power tube pair to form a Chireix amplifier combiner.

18. The integrated circuit according to claim 17, wherein an electrical length of the first coupled line and an electrical length of the second coupled line are used to determine a first back-off high-efficiency point of the Chireix amplifier combiner.

19. The integrated circuit according to claim 15, wherein a configuration of the first matching network and the second matching network enables the first amplifier and the second amplifier to form a peak power tube pair, wherein a configuration of the third matching network and the fourth matching network enables the third amplifier and the fourth amplifier to form a Chireix power tube pair, and wherein a configuration of the first coupled line and the second coupled line enables the Chireix power tube pair and the peak power tube pair to form a Doherty amplifier combiner.

20. The integrated circuit according to claim 15, wherein a configuration of the first matching network and the second matching network enables the first amplifier and the second amplifier to form a first Chireix power tube pair, wherein a configuration of the third matching network and the fourth matching network enables the third amplifier and the fourth amplifier to form a second Chireix power tube pair, and wherein a configuration of the first coupled line and the second coupled line enables the first Chireix power tube pair and the second Chireix power tube pair to form a Chireix amplifier combiner.

* * * * *